United States Patent
Chung et al.

(10) Patent No.: US 11,569,469 B2
(45) Date of Patent: *Jan. 31, 2023

(54) LIGHT EMITTING DEVICE AND DISPLAY DEVICE INCLUDING THE SAME

(71) Applicant: SAMSUNG ELECTRONICS CO., LTD., Suwon-si (KR)

(72) Inventors: Dae Young Chung, Suwon-si (KR); Kwanghee Kim, Seoul (KR); Hongkyu Seo, Anyang-si (KR); Eun Joo Jang, Suwon-si (KR); Oul Cho, Suwon-si (KR); Tae Hyung Kim, Seoul (KR); Yuho Won, Seoul (KR); Hee Jae Lee, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 15 days.

This patent is subject to a terminal disclaimer.

(21) Appl. No.: 17/205,015

(22) Filed: Mar. 18, 2021

(65) Prior Publication Data

US 2021/0226145 A1  Jul. 22, 2021

Related U.S. Application Data

(63) Continuation of application No. 16/549,472, filed on Aug. 23, 2019, now Pat. No. 10,978,658.

(30) Foreign Application Priority Data

Aug. 24, 2018 (KR) .................. 10-2018-0099520

(51) Int. Cl.
*H01L 51/50* (2006.01)
*H01L 51/00* (2006.01)
*H01L 51/56* (2006.01)

(52) U.S. Cl.
CPC ........ *H01L 51/502* (2013.01); *H01L 51/0092* (2013.01); *H01L 51/56* (2013.01);
(Continued)

(58) Field of Classification Search
CPC ....... C09K 11/025; C09K 11/06; H01L 51/50; H01L 51/502; H01L 51/0092; H01L 51/56

See application file for complete search history.

(56) References Cited

U.S. PATENT DOCUMENTS 8,120,010 B2 * 2/2012 Cho ................. H05B 33/14
                                                    438/45
8,330,142 B2   12/2012 Cho et al.
(Continued)

FOREIGN PATENT DOCUMENTS

CN     106206967 A    12/2016
EP     2184333 A3      5/2012
(Continued)

OTHER PUBLICATIONS

Bokyoung Lee et al., "Layer-by-Layer Growth of Polymer/Quantum Dot Composite Multilayers by Nucleophilic Substitution in Organic Media," Angewandte Chemie, Dec. 3, 2009, pp. 369-373, vol. 122.

(Continued)

*Primary Examiner* — Changhyun Yi
(74) *Attorney, Agent, or Firm* — Cantor Colburn LLP

(57) ABSTRACT

A light emitting device, a method of manufacturing the same, and a display device including the same are disclosed. The light emitting device including a first electrode and a second electrode facing each other, an emission layer disposed between the first electrode and the second electrode, the emission layer including quantum dots, and a charge auxiliary layer disposed between the emission layer and the (Continued)

second electrode, wherein the emission layer includes a first surface facing the charge auxiliary layer and an opposite second surface, the quantum dots include a first organic ligand on a surface of the quantum dots, in the emission layer, an amount of the first organic ligand in a portion adjacent to the first surface is larger than an amount of the first organic ligand in a portion adjacent to the second surface.

21 Claims, 7 Drawing Sheets

(52) U.S. Cl.
CPC ...... *H01L 51/0035* (2013.01); *H01L 51/0039* (2013.01); *H01L 2251/303* (2013.01)

(56) References Cited

U.S. PATENT DOCUMENTS

| | | | |
|---|---|---|---|
| 8,552,416 B2 | 10/2013 | Kim et al. | |
| 9,385,194 B2 * | 7/2016 | Cho | ............... H01L 29/0665 |
| 2014/0302627 A1 | 10/2014 | Ko et al. | |
| 2014/0361228 A1 | 12/2014 | Jang et al. | |
| 2017/0352827 A1 | 12/2017 | Cho et al. | |
| 2019/0123292 A1 | 4/2019 | Woo et al. | |
| 2019/0334107 A1 | 10/2019 | Lee et al. | |
| 2019/0390109 A1 | 12/2019 | Ippen et al. | |

FOREIGN PATENT DOCUMENTS

| | | |
|---|---|---|
| EP | 3327813 A1 | 5/2018 |
| KR | 20100095875 A | 9/2010 |
| KR | 20110129121 A | 12/2011 |
| KR | 20120047481 A | 5/2012 |
| KR | 20130047943 A | 5/2013 |
| KR | 1505423 B1 | 3/2015 |
| KR | 20160033520 A | 3/2016 |
| KR | 1020160093429 A | 8/2016 |
| KR | 1794082 B1 | 11/2017 |

OTHER PUBLICATIONS

Extended European Search Report dated Dec. 5, 2019, of the corresponding European Patent Application No. 19193423.1.
Kjun Cho et al., "Multifunctional Dendrimer Ligands for High-Efficiency, Solution-Processed Quantum Dot Light-Emitting Diodes," ACS NANO, Dec. 14, 2016, pp. 684-692, vol. 11.

* cited by examiner

LIGHT EMITTING DEVICE AND DISPLAY DEVICE INCLUDING THE SAME

CROSS-REFERENCE TO RELATED APPLICATION

This application is a continuation application of application Ser. No. 16/549,472, filed Aug. 23, 2019, which claims priority to and the benefit of Korean Patent Application No. 10-2018-0099520 filed in the Korean Intellectual Property Office on Aug. 24, 2018, all the benefits accruing therefrom under 35 U.S.C. § 119, the content of which in its entirety is herein incorporated by reference.

BACKGROUND

1. Field

A light emitting device and a display device are disclosed.

2. Description of the Related Art

Physical characteristics (e.g., energy bandgaps, melting points, etc.) of nanoparticles that are intrinsic characteristics may be controlled by changing the particle sizes of the nanoparticles, unlike bulk materials. For example, when being are supplied with photoenergy or electric energy, semiconductor nanocrystals (also referred to as quantum dots) may emit light in a wavelength corresponding to sizes of the quantum dots. Accordingly, the quantum dots may be used as a light emitting element emitting light of a predetermined wavelength.

SUMMARY

A light emitting device may include quantum dots as a light emitting element. Improvement in performance of light emitting devices including quantum dots is desired.

An embodiment provides a light emitting device capable of realizing improved performance.

An embodiment provides a display device including the light emitting device.

A light emitting device according to an embodiment includes
a first electrode and a second electrode facing each other,
an emission layer disposed between the first electrode and the second electrode, the emission layer including quantum dots, and
a charge auxiliary layer disposed between the emission layer and the second electrode,
wherein the emission layer includes a first surface facing the charge auxiliary layer and an opposite second surface,
the quantum dots include a first organic ligand (e.g., bound on a surface thereof), and
in the emission layer, an amount (e.g., a concentration) of the first organic ligand in a portion adjacent to the first surface is larger than an amount of the first organic ligand in a portion adjacent to the second surface.

The amount of the first organic ligand in the portion adjacent to the first surface may be at least about 20% larger than the amount of the first organic ligand in the portion adjacent to the second surface.

The amount of the first organic ligand in the portion adjacent to the first surface may be at least about 30% larger than the amount of the first organic ligand in the portion adjacent to the second surface.

The charge auxiliary layer may include nanoparticles including zinc metal oxide.

The zinc metal oxide may be represented by Chemical Formula 1:

$$Zn_{1-x}M_xO \qquad \text{Chemical Formula 1}$$

In Chemical Formula 1,
M is Mg, Ca, Zr, W, Li, Ti, Y, Al, or a combination thereof, and
$0 \leq x \leq 0.5$.

The metal oxide may include zinc oxide, zinc magnesium oxide, or a combination thereof.

An average particle size of the nanoparticles may be greater than or equal to about 1 nanometer (nm).

An average particle size of the nanoparticles may be less than or equal to about 10 nm.

A work function of the first electrode may be greater than a work function of the second electrode.

The first electrode may include indium tin oxide.

The second electrode may include a conductive metal.

The quantum dots may not include cadmium.

The quantum dots may include indium and phosphorus.

The quantum dots may include a chalcogen element and zinc.

The quantum dots may be configured to emit light having a same color.

In the emission layer, the portion adjacent to the second surface may further include a halogen.

The halogen may include fluorine, chlorine, bromine, iodine, or a combination thereof.

The halogen may be chlorine.

In the emission layer, the portion adjacent to the first surface (e.g., a first emission layer) may not include chlorine.

In the emission layer, the portion adjacent to the first surface (e.g., a first emission layer) may further include chlorine.

In the emission layer, an amount of a halogen (e.g., chlorine) in the portion adjacent to the second surface (e.g., a second emission layer) may be greater than an amount of a halogen (e.g., chlorine) in the portion adjacent to the first surface (e.g., a first emission layer).

A hole mobility in the portion adjacent to the first surface may be less than a hole mobility in the portion adjacent to the second surface. A hole mobility in the portion adjacent to the second surface may be greater than a hole mobility in the portion adjacent to the first surface.

The first organic ligand may include RCOOH, $RNH_2$, $R_2NH$, $R_3N$, RSH, $R_3PO$, $R_3P$, ROH, RCOOR, $RPO(OH)_2$, RHPOOH, RHPOOH, or a combination thereof, wherein, each R is independently a C3 to C40 substituted or unsubstituted aliphatic hydrocarbon group, a C6 to C40 substituted or unsubstituted aromatic hydrocarbon group, or a combination thereof.

The first organic ligand may not include a thiol organic ligand.

The thiol organic ligand may include RSH wherein, R is independently a C3 to C40 substituted or unsubstituted aliphatic hydrocarbon group, a C6 to C40 substituted or unsubstituted aromatic hydrocarbon group, or a combination thereof.

A thickness of the emission layer may be greater than or equal to about 2 nm.

A thickness of the emission layer may be greater than or equal to about 20 nm.

A thickness of the emission layer may be less than or equal to about 100 nm.

The emission layer may include a first emission layer including the first surface and a second emission layer including the second surface.

Each of the first emission layer and the second emission layer may include the first organic ligand.

A thickness of the first emission layer may be greater than or equal to about 3 nm.

A thickness of the first emission layer may be less than or equal to about 50 nm.

A thickness of the second emission layer may be greater than or equal to about 3 nm.

A thickness of the second emission layer may be less than or equal to about 50 nm.

The first emission layer may not include a halogen.

The second emission layer may further include a halogen (e.g., chlorine).

The first emission layer may further include chlorine.

An amount of chlorine in the second emission layer may be greater than an amount of chlorine in the first emission layer.

A hole mobility in the second emission layer may be greater than a hole mobility in the first emission layer.

The hole mobility in the second emission layer may be at least 1.5 times of the hole mobility in the first emission layer.

The hole mobility in the second emission layer may be at least 2 times of the hole mobility in the first emission layer.

The second emission layer may be insoluble to a C1 to C10 alcohol solvent, cyclohexyl acetate, acetone, toluene, hexane, cyclohexane, a C1 to C10 alkane solvent, or a combination thereof.

The first emission layer may be insoluble to a C1 to C10 alcohol solvent.

The second emission layer may not include an arylamine, a thiol compound, or a combination thereof.

The second emission layer may further include a second organic ligand that is different from the first organic ligand. The second organic ligand may include a C3 to C20 organic compound including a thiol group and an alcohol group.

The first emission layer may not include an organic compound including a heterocycle including oxygen, sulfur, nitrogen, or silicon.

The first emission layer may further include a second organic ligand that is different from the first organic ligand and the second organic ligand may further include C3 to C40 alkane thiol.

The first emission layer and/or the second emission layer may not include a thiol organic ligand.

In an embodiment, a method of manufacturing the aforementioned light emitting device includes, forming the emission layer on the first electrode; forming the charge auxiliary layer on the emission layer; and forming the second electrode on the charge auxiliary layer, wherein the forming of the emission layer includes forming a first layer including a plurality of quantum dots having a first organic ligand on the surface;

removing the ligand from the first layer to remove at least a portion of the first organic ligand; and forming a second layer including the quantum dots including the first organic ligand on the surface of the quantum dots;

removing at least a portion (or a portion of) of the first organic ligand from the first layer to form a treated first layer; and forming a second layer including the quantum dots including the first organic ligand on the surface of the quantum dots on the treated first layer to provide the light emitting device, wherein the second layer comprises the amount of the first organic ligand larger than the amount of the first organic ligand in the treated first layer.

Removing at least a portion of the first organic ligand from the first layer may include, preparing an alcohol solution of a metal halide;

contacting the alcohol solution with the first layer; and removing the alcohol solution from the first layer and drying the first layer.

The metal halide may include a zinc halide.

The metal halide may include a fluoride, a chloride, a bromide, an iodide, or a combination thereof.

Removing at least a portion of the first organic ligand from the first layer may including removing greater than or equal to about 20 weight percent of the first organic ligand from the first layer, based on a total weight of the first organic ligand in the first layer.

An embodiment provides a display device including the aforementioned light emitting device.

In an embodiment, a method of manufacturing a light emitting device includes:

obtaining an emission layer, wherein the emission layer comprises quantum dots comprising a first organic ligand;

changing an amount of the first organic ligand on at least one surface of the emission layer;

contacting a charge auxiliary layer with a first surface of the emission layer;

contacting a second electrode with the charge auxiliary layer; and contacting a second surface of the emission layer with a first electrode, wherein the second surface of the emission layer is opposite the first surface of the emission layer, wherein an amount of the organic ligand in a portion adjacent to the first surface of the emission layer is larger than an amount of the organic ligand in a portion adjacent to the second surface of the emission layer, and wherein a thickness of the portion of the emission layer adjacent to the first surface of the emission layer is equal to a thickness of the portion of the emission layer adjacent to the second surface of the emission layer.

According to an embodiment, an electroluminescent device having improved efficiency and life-span simultaneously improve may be provided.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
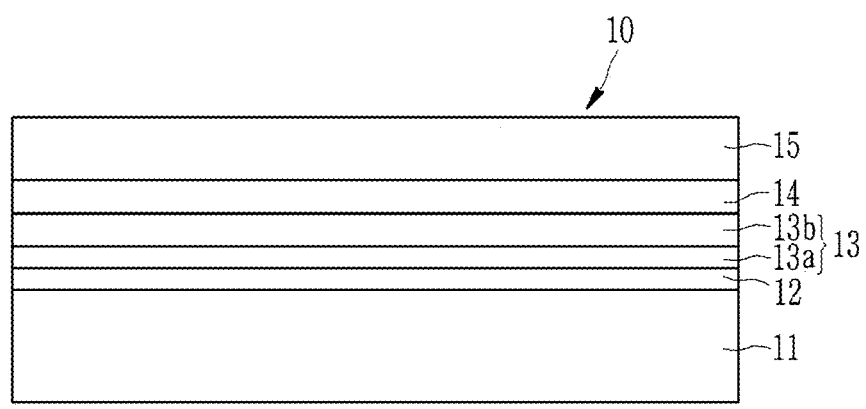
FIG. 1 is a schematic cross-sectional view of a quantum dot (QD) light emitting diode (LED) device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "upper," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "upper," can therefore, encompasses both an orientation of "lower" and "upper," depending on the particular orientation of the figure.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function or energy level (e.g., a highest occupied molecular orbital (HOMO) energy level or lowest unoccupied molecular orbital (LUMO) energy level) is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or energy level has a small absolute value based on "0 eV" of the vacuum level.

As used herein, "Group" may refer to a group of Periodic Table.

As used herein, "Group I" may refer to Group IA and Group IB, and examples thereof may include Li, Na, K, Rb, and Cs, but are not limited thereto.

As used herein, "Group II" may refer to Group IIA and Group IIB, and examples of a Group II metal may be Cd, Zn, Hg, and Mg, but are not limited thereto.

As used herein, "Group III" may refer to Group IIIA and Group IIIB, and examples of a Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples thereof may include nitrogen, phosphorus, arsenic, antimony, and bismuth, but are not limited thereto.

As used herein, "Group VI" may refer to Group VIA, and examples thereof may include sulfur, selenium, and tellurium, but are not limited thereto.

As used herein, when a definition is not otherwise provided, "substituted" refers to replacement of hydrogen of a compound, a group, or a moiety by a C1 to C30 alkyl group, a C2 to C30 alkenyl group, a C2 to C30 alkynyl group, a C2 to C30 epoxy group, a C2 to C30 alkenyl group, a C2 to C30 alkylester group, a C3 to C30 alkenylester group (e.g., acrylate group, methacrylate group), a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a thiocyanate group (—SCN), a cyano group (—CN), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, a hydrocarbon group refers to a group including carbon and hydrogen (e.g., alkyl, alkenyl, alkynyl, aryl group, etc.). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aryl" refers to a group formed by removal of at least one hydrogen from an aromatic group (e.g., phenyl or naphthyl group).

As used herein, when a definition is not otherwise provided, "hetero" refers to one including 1 to 3 heteroatoms of N, O, S, Si, P, or a combination thereof.

As used herein, when a definition is not otherwise provided, "heteroaryl" refers to an aromatic group that comprises at least one heteroatom covalently bonded to one or more carbon atoms of aromatic ring.

As used herein, an average size of particles (or quantum dots) may be determined by using an electron microscope analysis and optionally a commercially available image analysis program (Image J). The average may be mean or median.

FIG. 1 is a schematic cross-sectional view of a light emitting device according to an embodiment.

Referring to FIG. 1, a light emitting device 10 according to an embodiment includes a first electrode 11 and a second electrode 15 facing each other, an emission layer 13 disposed between the first electrode 11 and the second electrode 15 and including quantum dots, and a charge auxiliary layer disposed between the emission layer and the second electrode, wherein the emission layer 13 includes a first surface facing the charge auxiliary layer and an opposite second surface, the quantum dots include a first organic ligand on the surface, and in the emission layer, an amount (or a concentration), e.g., a total weight or a number of molecules, of the organic ligand at a portion adjacent to the first surface is larger, e.g., greater, than an amount, e.g., a total weight or a number of molecules, of the organic ligand at a portion adjacent to the second surface.

A thickness of the portion of the emission layer adjacent to the first surface may be equal to (or different from) a thickness of the portion of the emission layer adjacent to the second surface. A thickness of the portion of the emission layer adjacent to the first surface may be less than or equal to a thickness of the portion of the emission layer adjacent to the second surface. A thickness of the portion of the emission layer adjacent to the first surface may be greater than or equal to a thickness of the portion of the emission layer adjacent to the second surface.

The thickness of the portion of the emission layer adjacent to the first (or the second) surface may be 5 nm, 10 nm, 15 nm, 20 nm, or 25 nm as measured from the first (or second) surface.

The charge auxiliary layer may include a hole auxiliary layer 12 between the first electrode 11 and the emission layer 13 or an electron auxiliary layer 14 between the second electrode 15 and the emission layer 13.

The light emitting device may further include a substrate. The substrate may be disposed at the side of the first electrode 11 or the second electrode 15. In an embodiment, the substrate may be disposed at the side of the first electrode. The substrate may be a substrate including an insulation material (e.g., insulating transparent substrate). The substrate may include glass; various polymers such as polyester (e.g., polyethyleneterephthalate (PET), polyethylenenaphthalate (PEN)), polycarbonate, polyacrylate, polyimide, and polyamideimide; polysiloxane (e.g., PDMS); inorganic materials such as Al$_2$O$_3$ and ZnO; or a combination thereof, but is not limited thereto. The substrate may be made of a silicon wafer, and the like. Herein "transparent" may refer to the case where transmittance of the substrate for light in a predetermined wavelength (e.g., light emitted from the quantum dots) may be greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected considering a substrate material, and the like, but is not particularly limited. The transparent substrate may have flexibility. The substrate may be omitted.

One of the first electrode 11 and the second electrode 15 may be an anode and the other may be a cathode. For example, the first electrode 11 may be an anode and the second electrode 15 may be a cathode.

The first electrode 11 may be made of a conductor, for example a metal, a conductive metal oxide, or a combination thereof. The first electrode 11 may be for example made of a metal, such as nickel, platinum, vanadium, chromium, copper, zinc, and gold, or an alloy thereof; a conductive metal oxide, such as zinc oxide, indium oxide, tin oxide, indium tin oxide (ITO), indium zinc oxide (IZO), or fluorine doped tin oxide; or a combination of metal and oxide, such as ZnO and Al or SnO$_2$ and Sb; and the like, but is not limited thereto. In an embodiment, the first electrode may include a transparent conductive metal oxide, for example, indium tin oxide. A work function of the first electrode may be higher than a work function of the second electrode that will be described later. A work function of the first electrode may be lower than a work function of the second electrode that will be described later.

The second electrode 15 may be made of a conductor, for example a metal, a conductive metal oxide, a conductive polymer, or a combination thereof. The second electrode 15 may be for example a metal, such as aluminum, magnesium, calcium, sodium, potassium, titanium, indium, yttrium, lithium, gadolinium, silver, gold, platinum, tin, lead, cesium, or barium, or an alloy thereof; a multi-layer structured material, such as LiF/Al, $Li_2O$/Al, Liq/Al, LiF/Ca, and $BaF_2$/Ca, but is not limited thereto. The conductive metal oxide is the same as described above.

The work function of the first electrode may be greater than a work function of the second electrode. The work function of the first electrode may be lower than a work function of the second electrode.

In an embodiment, a work function of the first electrode 11 may be for example about 4.5 electronvolts (eV) to about 5.0 eV (e.g., about 4.6 eV to about 4.9 eV) and a work function of the second electrode 15 may be for example greater than or equal to about 4.0 eV and less than 4.5 eV (e.g., about 4.0 eV to about 4.3 eV). In an embodiment, the work function of the second electrode 15 may be for example about 4.5 eV to about 5.0 eV (e.g., about 4.6 eV to about 4.9 eV) and the work function of the first electrode 11 may be for example greater than or equal to about 4.0 eV and less than about 4.5 eV (e.g., about 4.0 eV to about 4.3 eV).

The first electrode 11, the second electrode 15, or a combination thereof may be a light-transmitting electrode, and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of for example an opaque conductor such as aluminum (Al), silver (Ag), or gold (Au).

A thickness of the electrodes (the first electrode, the second electrode, or a combination thereof) is not particularly limited and may be appropriately selected considering device efficiency. For example, the thickness of the electrodes may be greater than or equal to about 5 nm, for example, greater than or equal to about 50 nm. For example, the thickness of the electrodes may be less than or equal to about 100 μm, for example, less than or equal to about 10 μm, less than or equal to about 1 μm, less than or equal to about 900 nm, less than or equal to about 500 nm, or less than or equal to about 100 nm.

The emission layer 13 includes a first surface facing the charge auxiliary layer and the opposite second surface. The emission layer 13 may have a multi-layered structure. The emission layer includes (e.g., a plurality of) quantum dot(s). The quantum dots are nano-sized semiconductor nanocrystal particles and exhibit quantum confinement effects. The quantum dots may include a Group II-VI compound, a Group III-V compound, a Group IV-VI compound, a Group IV element or compound, a Group compound, a Group compound, a Group I-II-IV-VI compound, or a combination thereof.

The Group II-VI compound may be a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group II-VI compound may further include a Group III metal. The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group III-V compound may further include a Group II metal (e.g., InZnP). The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof. Examples of the Group compound may include $CuInSe_2$, $CuInS_2$, CuInGaSe, and CuInGaS, but are not limited thereto. Examples of the Group I-II-IV-VI compound may include CuZnSnSe and CuZnSnS, but are not limited thereto. The Group IV element or compound may be an elementary substance such as Si, Ge, or a combination thereof; a binary element compound such as SiC, SiGe, or a combination thereof; or a combination thereof.

In an embodiment, the quantum dots may not include a heavy metal (e.g., cadmium, lead, mercury, or a combination thereof). In an embodiment, the quantum dots may not include cadmium, lead, or a combination thereof. In an embodiment, the expression "not including the heavy metal" as used herein may refer to including the heavy metal substantially, for example, in an amount of less than about 100 parts per million (ppm), less than about 50 ppm, less than about 30 ppm, or less than about 20 ppm. The quantum dots may include a Group III-V compound-based semiconductor nanocrystal including indium and phosphorus. The Group III-V compound may further include zinc. The quantum dots may include a semiconductor nanocrystal including a Group II-VI compound including a chalcogen element (e.g., sulfur, selenium, tellurium, or a combination thereof) and zinc.

In the quantum dots, the aforementioned binary element compound, ternary element compound, the quaternary element compound, or a combination thereof respectively exist in a uniform concentration in the semiconductor nanocrystal particles or partially different concentrations in the same particles. The semiconductor nanocrystals may have a core/shell structure wherein a first semiconductor nanocrystal (core) surrounds another second semiconductor nanocrystal (shell) having the same or different composition. In an embodiment, the quantum dots may include a core including the aforementioned compounds (i.e., Group II-VI compound, Group III-V compound, Group IV-VI compound, Group IV element or compound, Group I-III-VI compound, Group compound, Group I-II-IV-VI compound, or a combination thereof), and a shell having a different composition from the core and including the aforementioned compounds.

The core may include InP, InZnP, ZnSe, ZnSeTe, or a combination thereof. The shell may include InP, InZnP, ZnSe, ZnS, ZnSeTe, ZnSeS, or a combination thereof. The shell may include a multi-layered shell having at least two layers. The shell may include Zn, Se, and optionally S (e.g., directly) on the core. The shell may include zinc and sulfur in the outermost layer.

The core and the shell may have an interface, and an element in the interface may have a concentration gradient wherein the concentration of the element of the shell decreases toward the core. The semiconductor nanocrystal may have a structure including one semiconductor nanocrystal core and a multi-layered shell surrounding the same. Herein, the multi-layered shell has at least two shells wherein each shell may have a single composition, an alloy, or the one having a concentration gradient.

In the quantum dots, the shell material and the core material may have different energy bandgaps from each other. For example, the energy bandgaps of the shell material may be greater than that of the core material. According to an embodiment, the energy bandgaps of the shell material may be less than that of the core material. The quantum dots may have a multi-layered shell. In the multi-layered shell, the energy bandgap of the outer layer may be greater than the energy bandgap of the inner layer (i.e., the layer nearer to the core). In the multi-layered shell, the energy bandgap of the outer layer may be less than the energy bandgap of the inner layer.

In an embodiment, the quantum dots may include a core including a first semiconductor nanocrystal including indium, phosphorus, and optionally zinc and a shell disposed on the core and including a second semiconductor nanocrystal including zinc and a chalcogen element. In an embodiment, the quantum dots may include a core including a first semiconductor nanocrystal including zinc, selenium, and optionally tellurium and a shell disposed on the core and including a second semiconductor nanocrystal including zinc and a chalcogen element.

The quantum dots may have a particle size of greater than or equal to about 1 nm and less than or equal to about 100 nm. The quantum dots may have a particle size of about 1 nm to about 20 nm, for example, greater than or equal to about 2 nm, greater than or equal to about 3 nm, greater than or equal to about 4 nm, greater than or equal to about 5 nm, greater than or equal to about 6 nm, greater than or equal to about 7 nm, or greater than or equal to about 8 nm and less than or equal to about 50 nm, less than or equal to about 40 nm, less than or equal to about 30 nm, less than or equal to about 20 nm, less than or equal to about 15 nm, less than or equal to about 10 nm, less than or equal to about 9 nm, or less than or equal to about 8 nm. The shape of the quantum dots is not particularly limited. For example, the shape of the quantum dots may be a sphere, a polyhedron, a pyramid, a multipod, a square (cube or cuboid), a rectangular parallelepiped, a nanotube, a nanorod, a nanowire, a nanosheet, or a combination thereof, but is not limited thereto.

The aforementioned quantum dots may be commercially available or appropriately synthesized.

In the light emitting device according to an embodiment, the quantum dots may include a first organic ligand on the surfaces of the quantum dots.

The first organic ligand may have a hydrophobic moiety. The first organic ligand may be bound to the surfaces of the quantum dots. The first organic ligand may include RCOOH, $RNH_2$, $R_2NH$, $R_3N$, RSH, $R_3PO$, $R_3P$, ROH, RCOOR, $RPO(OH)_2$, RHPOOH, RHPOOH, or a combination thereof, wherein each R is independently a C3 to C40, or C5 to C40 substituted or unsubstituted aliphatic hydrocarbon group such as a substituted or unsubstituted C3 to C40 alkyl or alkenyl, a C6 to C40 substituted or unsubstituted aromatic hydrocarbon group such as a substituted or unsubstituted C6 to C40 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compound such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, diphenyl phosphine, triphenyl phosphine, or trioctyl phosphine; a phosphine oxide compound such as methyl phosphine oxide, ethyl phosphine oxide, propyl phosphine oxide, butyl phosphine oxide pentyl phosphineoxide, tributyl phosphine oxide, octyl phosphine oxide, dioctyl phosphine oxide, diphenyl phosphine oxide, triphenyl phosphine oxide, or trioctyl phosphine oxide; a C5 to C20 alkyl phosphinic acid such as hexyl phosphinic acid, octyl phosphinic acid, dodecane phosphinic acid, tetradecane phosphinic acid, hexadecane phosphinic acid, octadecane phosphinic acid; an alkylphosphonic acid such as a C5 to C20 alkylphosphonic acid, for example, hexyl phosphonic acid, octyl phosphonic acid, dodecane phosphonic acid, tetradecane phosphonic acid, hexadecane phosphonic acid, or octadecane phosphonic acid; and the like, but are not limited thereto. The quantum dots may include a hydrophobic organic ligand that is the same, or a mixture of at least two different hydrophobic organic ligands. The hydrophobic organic ligand may not include a photopolymerizable moiety (e.g., an acrylate group, a methacrylate group, etc.).

The quantum dots may include an organic ligand and a halogen (e.g., chlorine) on a surface thereof (hereinafter, also referred to as halogen (Cl)-treated quantum dot).

In the halogen-treated quantum dots, an amount of organics may be greater than or equal to about 1 wt %, for example, greater than or equal to about 2 wt %, greater than or equal to about 3 wt %, greater than or equal to about 4 wt %, greater than or equal to about 5 wt %, or greater than or equal to about 6 wt % and/or less than or equal to about 10 wt %, less than or equal to about 9.5 wt %, less than or equal to about 9 wt %, or less than or equal to about 8 wt % e.g., e.g., as confirmed by a thermogravimetric analysis.

In the halogen-treated quantum dots, an amount of the halogen may be greater than or equal to about 1 microgram (μg), greater than or equal to about 1.5 μg, greater than or equal to about 3 μg, greater than or equal to about 4 μg, greater than or equal to about 5 μg, greater than or equal to about 6 μg, greater than or equal to about 7 μg, greater than or equal to about 8 μg, greater than or equal to about 9 μg, greater than or equal to about 10 μg, greater than or equal to about 11 μg, greater than or equal to about 12 μg, greater than or equal to about 12.5 μg, greater than or equal to about 13 μg, greater than or equal to about 14 μg, greater than or equal to about 15 μg, greater than or equal to about 16 μg, greater than or equal to about 17 μg, greater than or equal to about 18 μg, or greater than or equal to about 19 μg and/or less than about 30 μg, less than or equal to about 25 μg, less than or equal to about 20 μg, less than or equal to about 19.5 μg, less than or equal to about 19 μg, less than or equal to about 18 μg, less than or equal to about 17 μg, less than or equal to about 15 μg, less than or equal to about 12.5 μg, or less than or equal to about 12 μg, per 1 milligram (mg) of the quantum dots, e.g., as confirmed by an ion chromatography. The halogen may be chlorine.

The halogen treated quantum dots may be included in the portion adjacent to the first surface (e.g., a first emission layer). The halogen treated quantum dots may be included in the portion adjacent to the second surface (e.g., a second emission layer). In an embodiment, the portion adjacent to the first surface (e.g., a first emission layer) may include the halogen treated quantum dots and the portion adjacent to the second surface (e.g., a second emission layer) may be formed by a treatment of removing an organic ligand (e.g., spin dry treatment) that will be set forth below.

The halogen treated quantum dots may be prepared by a method that includes:

obtaining an organic dispersion including a plurality of quantum dots including first organic ligands on the surfaces and a first organic solvent;

obtaining a halide (e.g., chloride) solution including a polar organic solvent compatible with the first organic solvent and a metal halide; and adding the halide solution to the organic dispersion so that a content of the metal halide based on a total weight of the quantum dots may be greater than or equal to about 0.1 wt % and less than or equal to about 10 wt %, and stirring the resultant at a temperature of greater than or equal to about 45° C., for example, greater than or equal to about 50° C., greater than or equal to about 55° C., or greater than or equal to about 60° C. and less than or equal to about 150° C., less than or equal to about 140° C., less than or equal to about 100° C., less than or equal to about 90° C., less than or equal to about 80° C., or less than or equal to about 70° C., wherein a volume ratio of the polar organic solvent relative to the first organic solvent is less than or equal to about 0.1. A volume ratio of the polar organic solvent relative to the first organic solvent may be less than or equal to about 0.05. A volume ratio of the polar organic solvent relative to the first organic solvent may be greater than or equal to about 0.001, greater than or equal to about 0.005, or greater than or equal to about 0.01.

The metal halide (chloride) includes zinc, indium, gallium, magnesium, lithium, or a combination thereof. The first organic solvent may include a substituted or unsubstituted C5 to C40 aliphatic hydrocarbon, a substituted or unsubstituted C6 to C40 aromatic hydrocarbon, a C3 to C40 alicyclic hydrocarbon, or a combination thereof. The polar organic solvent may include a C1 to C10 alcohol, or a combination thereof.

The emission layer 13 may not include a thiol organic ligand (e.g., represented by RSH wherein, R is independently a C3 to C40 substituted or unsubstituted aliphatic hydrocarbon group, a C6 to C40 substituted or unsubstituted aromatic hydrocarbon group, or a combination thereof).

The emission layer 13 may include a first surface facing the charge auxiliary layer (e.g., electron auxiliary layer or hole auxiliary layer) that will be described later and an opposite second surface. In the emission layer, the amount (e.g., the concentration) of the organic ligand in the portion adjacent to the first surface may be larger than the amount of the organic ligand at the portion adjacent to the second surface. The charge auxiliary layer may be the electron auxiliary layer 14. In an embodiment, a hole transport capability (or hole mobility) in the portion adjacent to the second surface may be greater than a hole transport ability (or hole mobility) in the portion adjacent to the first surface.

Herein, a thickness of the portion adjacent to the first surface or the second surface may be greater than or equal to about 1 nm, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm. A thickness of the portion adjacent to the first surface or the second surface may be less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 20 nm. The portion adjacent to the first surface or the portion adjacent to the second surface may correspond to each of the first emission layer 13b or the second emission layer 13a that will be described later.

The quantum dots may provide high color reproducibility and may be used as a next-generation display material in terms of forming an emission layer in a solution process. Colloid synthesized quantum dots may include organic ligands (e.g., organic compounds including long-chain aliphatic hydrocarbon and a functional group, such as oleic acid (OA)) on the surfaces. Such an organic ligand may help dispersibility of the quantum dots in mediums, but the organic ligand may interfere with charge flows in the quantum dots formed as a monolayer. Accordingly, it may be difficult to balance the electrons/holes in the electroluminescent device including the quantum dot emission layer. For example, when a flow of positive charges (holes) relative to negative charges (electrons) is limited in the quantum dot emission layer, a light emitting region may be produced not inside the emission layer but on an interface between a hole auxiliary layer (e.g., hole transport layer (HTL)) and a QD layer, and excitons produced on the interface may be extinguished relatively easily, which may have a negative influence on device efficiency. According to the present inventors' research, extra electrons not recombined on the interface due to high lowest unoccupied molecular orbital (LUMO) energy of QD in QD-LED emitting blue light may move toward the hole transport layer (HTL), and accordingly, the device efficiency may be more severely deteriorated.

However, a light emitting device according to an embodiment has an emission layer having the aforementioned structure and thus may show prolonged life-span characteristics as well as improved electroluminescence properties. Without being bound by any particular theory, the aforementioned structure of the light emitting device according to an embodiment may induce the light emitting region produced through an electron-hole recombination to be formed in the center of the emission layer (EML), and accordingly, the device may show improved properties.

The present inventors have found that an amount change of the organic ligands (or the halogen or the chlorine that will be described below) may have a direct influence on hole (or charge) transport capability of the emission layer, and accordingly, when an amount of the organic ligands in the emission layer is adjusted as described above, the electron-hole recombination may be formed in the center of the emission layer.

In an embodiment, an emission layer including a relatively small amount of the organic ligands (e.g., oleic acid) (or a relatively large amount of the halogen or the chlorine) may show improved hole transfer (HT) characteristics (e.g., hole mobility). Accordingly, when quantum dots having a relatively small (less) amount of the organic ligands (or a greater amount of the halogen or the chlorine) are formed to face the hole auxiliary layer, and quantum dots having a relatively large amount of the organic ligands (e.g., oleic acid) (or a less amount of the halogen or the chlorine) are formed to face a charge (electron) auxiliary layer, the device may show improved electroluminescence properties. In other words, changing an amount of the organic ligands (the halogen or the chlorine) in a thickness direction may make it possible to dispose the quantum dots having improved hole transport characteristics near to the hole transport layer (HTL) and to dispose the quantum dots having improved electron transport characteristics disposed near to the electron transport layer (ETL). Accordingly, the quantum dot emission layer may have a changing amount of organic ligands in a thickness direction through a manufacturing method described later and whereby the light emitting region may move toward the center of the layer and the device according to an embodiment may show improved electroluminescence properties (efficiency and luminance) and a prolonged life-span.

In an embodiment, the amount of the organic ligand at the portion adjacent to the first surface may be larger than the amount of the organic ligand at the portion adjacent to the second surface by at least about 20%.

In an embodiment, (e.g., based on a total weight of the quantum dots) colloid quantum dots prepared in an organic solvent under the presence of, e.g., with, the organic ligand may include an organic material in an amount of at least about 10%, for example, greater than or equal to about 15%, greater than or equal to about 20%, and less than or equal to about 50%, less than or equal to about 30%, or less than or equal to about 20% e.g., bound to the surfaces thereof. A surface treatment using a halogen compound may change (reduce) the amount of the organic ligand of the quantum dots.

Thus, in an embodiment, as determined by an analysis such as thermogravimetric analysis, an amount, e.g., a total weight of an organic material (e.g., the amount or weight of the organic ligand at the portion adjacent to the first surface, hereinafter referred to as a "first amount") of the colloid quantum dots may be greater than or equal to about 5%, greater than or equal to about 8%, greater than or equal to about 10%, greater than or equal to about 15%, greater than or equal to about 16%, greater than or equal to about 17%, greater than or equal to about 18%, greater than or equal to about 19%, or greater than or equal to about 20% based on a total weight of the quantum dots. The first amount may be less than or equal to about 50%, less than or equal to about 40%, less than or equal to about 30%, less than or equal to about 20%, less than or equal to about 15%, or less than or equal to about 10% based on a total weight of the quantum dots.

The first amount may be greater than an amount of the organic ligand present in the portion adjacent to the second surface (e.g., the second amount) by at least about 5%, at least about 10%, at least about 20%, at least about 30%, at least about 40%, at least about 50%, at least about 60%, or at least about 70% in comparison with the second amount.

The second amount may be greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 10.5 wt %, greater than or equal to about 11 wt %, greater than or equal to about 11.5 wt %, greater than or equal to about 12 wt %, greater than or equal to about 12.5 wt % and less than or equal to about 20 wt %, less than or equal to about 19 wt %, less than or equal to about 18 wt %, less than or equal to about 17 wt %, less than or equal to about 16.7 wt %, 16 wt %, less than or equal to about 15.4 wt %, less than or equal to about 15 wt %, less than or equal to about 14 wt %, less than or equal to about 13 wt %, less than or equal to about 12 wt %, less than or equal to about 10.5% wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight of the quantum dots.

In an embodiment, the first amount may be greater than or equal to about 1.01 times, greater than or equal to about 1.02 times, greater than or equal to about 1.03 times, greater than or equal to about 1.04 times, greater than or equal to about 1.05 times, greater than or equal to about 1.06 times, greater than or equal to about 1.07 times, greater than or equal to about 1.08 times, greater than or equal to about 1.09 times, greater than or equal to about 1.1 times, greater than or equal to about 1.2 times, greater than or equal to about 1.3 times, greater than or equal to about 1.4 times, greater than or equal to about 1.5 times, greater than or equal to about 1.6 times, greater than or equal to about 1.7 times, greater than or equal to about 1.8 times, or greater than or equal to about 1.9 times as large as the second amount. The first amount may be less than or equal to about 3 times, less than or equal to about 2.9 times, less than or equal to about 2.8 times, less than or equal to about 2.7 times, less than or equal to about 2.6 times, less than or equal to about 2.5 times, less than or equal to about 2.4 times, less than or equal to about 2.3 times, less than or equal to about 2.2 times, or less than or equal to about 2.1 times as large as second amount. Herein, a difference between the amounts of the organic ligands may be for example confirmed by scanning or transmission electron microscope energy dispersive X-ray spectroscopy (e.g., scanning electron microscope energy dispersive spectroscopy (SEM-EDX)), and the like, but is not limited thereto. The difference of the organic ligand may be confirmed by the comparison of the carbon content of the quantum dots.

In an embodiment, when confirmed by infrared spectroscopy, a peak intensity of a functional group (e.g., carboxylic acid group) of the organic ligand at the portion adjacent to the first surface may be higher than a peak intensity of a functional group (e.g., carboxylic acid group) of the organic ligand at the portion adjacent to the second surface by at least about 20%, for example, at least about 21%, at least about 22%, at least about 23%, at least about 24%, at least about 25%, at least about 26%, at least about 27%, at least about 28%, at least about 29%, or at least about 30%. The peak intensity may represent an amount (e.g., a weight or a number of moles) of the organic ligand at each portion.

In an embodiment, when confirmed by X-ray photoelectron spectroscopy (XPS), in the (first or second) emission layer, a ratio of a peak area (or an amount) of carbon relative to a metal (e.g., zinc) of the quantum dot outermost shell may be less than or equal to about 10:1, less than or equal to about 9, less than or equal to about 8:1, less than or equal to about 7:1, less than or equal to about 6, less than or equal to about 5:1, less than or equal to about 4:1, less than or equal to about 3:1, less than or equal to about 2.9:1, less than or equal to about 2.8:1, less than or equal to about 2.7:1, less than or equal to about 2.67:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 2:1, less than or equal to about 1.9:1, less than or equal to about 1.8:1, less than or equal to about 1.7:1, less than or equal to about 1.6:1, less than or equal to about 1.5:1, less than or equal to about 1.4:1, or less than or equal to about 1.3:1. In the (first or second) emission layer, a ratio of a peak area (or an amount) carbon relative to a metal (e.g., zinc) of the quantum dot outermost shell may be greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, greater than or equal to about 0.9, greater than or equal to about 1, greater than or equal to about 1.1, greater than or equal to about 1.2, greater than or equal to about 1.3, greater than or equal to about 1.4, or greater than or equal to about 1.5.

For example, when confirmed by XPS, the emission layer according to an embodiment may exhibit a peak of a compound (e.g., zinc chloride) including a metal (e.g., zinc) and a halogen in the outermost shell of the quantum dots.

For example, when confirmed by SEM-EDX, in the emission layer, an amount of a non-metal (e.g., sulfur) relative to a metal (e.g., zinc) of the quantum dot outermost shell (e.g., as for the quantum dot in the portion adjacent to the second surface) may be detected. In the emission layer, an amount of non-metal (e.g., sulfur) relative to a metal (e.g., zinc) of the quantum dot outermost shell may be detected.

In the emission layer, the portion adjacent to the second surface (and/or the portion adjacent to the first surface) may further include a halogen. The halogen may include fluorine, chlorine, bromine, iodine, or a combination thereof. The presence of the halogen may be confirmed by X-ray photoelectron spectroscopy (XPS), but is not limited thereto. The presence of a bond of $ZnCl_2$ may be confirmed by the XPS of the emission layer. An amount of the halogen (e.g., confirmed by XPS or SEM-EDX) of the (first or second) emission layer may be greater than or equal to about 0.0001, for example, greater than or equal to about 0.0005, greater than or equal to about 0.001, greater than or equal to about 0.002, greater than or equal to about 0.003, greater than or equal to about 0.004, greater than or equal to about 0.005, greater than or equal to about 0.006, greater than or equal to about 0.007, greater than or equal to about 0.008, greater than or equal to about 0.009, greater than or equal to about 0.01, greater than or equal to about 0.02, greater than or equal to about 0.03, greater than or equal to about 0.04, greater than or equal to about 0.05, greater than or equal to about 0.06, greater than or equal to about 0.07, greater than or equal to about 0.08, greater than or equal to about 0.09, or greater than or equal to about 0.1, relative to Zn.

An amount of the halogen (e.g., confirmed by XPS or SEM-EDX) of the (first or second) emission layer may be less than or equal to about 0.9, for example, less than or equal to about 0.8, less than or equal to about 0.7, less than or equal to about 0.6, less than or equal to about 0.5, less than or equal to about 0.4, less than or equal to about 0.3, less than or equal to about 0.2, less than or equal to about 0.1, less than or equal to about 0.09, less than or equal to about 0.08, less than or equal to about 0.07, less than or equal to about 0.06, less than or equal to about 0.05, less than or equal to about 0.04, or less than or equal to about 0.03, relative to Zn.

In the emission layer, the quantum dots may control an absorption/emission wavelength by adjusting a composition and a size thereof. A maximum peak emission wavelength of the quantum dot may be an ultraviolet (UV) to infrared wavelength or a wavelength of greater than the above wavelength range. For example, the maximum peak emission wavelength of the quantum dot may be greater than or equal to about, 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum peak emission wavelength of the quantum dot may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum peak emission wavelength of the quantum dots may be in the range of about 500 nm to about 650 nm. The maximum peak emission wavelength of the quantum dots may be in the range of about 500 nm to about 550 nm (green). The maximum peak emission wavelength of the quantum dots may be in the range of about 600 nm to about 650 nm (red). In an embodiment, the quantum dots in the emission layer may be configured to emit light having the same color. For example, in the emission layer 13, the quantum dots at the portion adjacent to the first surface may be configured to emit light having the same color as the light emitted by the quantum dots at the portion adjacent to the second surface. Herein, a difference between the center wavelengths of these quantum dots may be about 15 nm at maximum, for example, less than or equal to about 10 nm, and in this case, a full width at half maximum (FWHM) of light (e.g., electroluminescence peak) emitted from the emission layer may be less than or equal to about 60 nm, less than or equal to about 50 nm, less than or equal to about 40 nm, less than or equal to about 35 nm, less than or equal to about 30 nm, less than or equal to about 25 nm, or less than or equal to about 20 nm.

In the emission layer 13, the quantum dots at the portion adjacent to the first surface may be configured to emit light having a different color from the quantum dots at the portion adjacent to the second surface. For example, the quantum dots at the portion adjacent to the first surface may have a maximum peak emission wavelength in a green (or red) range and the quantum dots at the portion adjacent to the second surface may have a maximum peak emission wavelength in a red (or green) range.

The quantum dots may have (electroluminescence or photoluminescence) quantum efficiency of greater than or equal to about 10%, for example, greater than or equal to about 30%, greater than or equal to about 50%, greater than or equal to about 60%, greater than or equal to about 70%, greater than or equal to about 90%, or about 100%. The quantum dots may have a relatively narrow emission spectrum. A (electro- or photo-) emission spectrum of the quantum dots may have for example a full width at half maximum (FWHM) of less than or equal to about 50 nm, for example less than or equal to about 45 nm, less than or equal to about 40 nm, less than or equal to about 35 nm, or less than or equal to about 30 nm.

The emission layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The emission layer 13 may have for example a thickness of about 10 nm to about 150 nm, for example about 10 nm to about 100 nm or about 10 nm to about 50 nm.

In an embodiment, the emission layer may include a first emission layer including the first surface 13b (e.g., facing the electron auxiliary layer) and a second emission layer including the second surface 13a (e.g., facing the hole auxiliary layer). In an embodiment, the emission layer may include a first emission layer including the first surface (e.g., facing the hole auxiliary layer) and a second emission layer including the second surface (e.g., facing the electron auxiliary layer). Each of the first emission layer and the second emission layer may include the first organic ligand. The first emission layer may correspond to the portion adjacent to the first surface. The second emission layer may correspond to the portion adjacent to the second surface.

A thickness of the first emission layer may be greater than or equal to about 3 nm, for example, greater than or equal to about 5 nm, greater than or equal to about 10 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 21 nm, greater than or equal to about 22 nm, greater than or equal to about 23 nm, greater than or equal to about 24 nm, or greater than or equal to about 25 nm. A thickness of the first emission layer may be less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 25 nm, or less than or equal to about 20 nm.

In an embodiment, the thickness of the first emission layer may be at least 1 monolayer (e.g., at least 2 monolayers) consisting of quantum dots, but is not limited thereto.

A thickness of the second emission layer may be greater than or equal to about 3 nm, for example, greater than or equal to about 5 nm, greater than or equal to about 10 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 21 nm, greater than or equal to about 22 nm, greater than or equal to about 23 nm, greater than or equal to about 24 nm, or greater than or equal to about 25 nm. A thickness of the second emission layer may be less than or equal to about 100 nm, for example, 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 25 nm or less than or equal to about 20 nm. In an embodiment, the thickness of the second emission layer may be 1 monolayer or more (e.g., 2 monolayers) consisting of quantum dots, but is not limited thereto.

The first emission layer and the second emission layer may include the same types of organic ligand. In an embodiment, the first emission layer and the second emission layer may include an organic ligand having a carboxylic acid group. In an embodiment, the first emission layer may include an organic ligand having a carboxylic acid moiety, an organic ligand having a thiol group, or a combination thereof, and the second emission layer may be an organic ligand having a carboxylic acid moiety. The second emission layer and/or the first emission layer may not include an organic ligand having a thiol group.

The first emission layer may include the organic ligand included in the second emission layer and may further include an organic ligand that is not included in the second emission layer. The second emission layer may further include a halogen. The halogen included in the emission layer is the same as described above.

The second emission layer may be (substantially) insoluble to a C1 to C10 alcohol solvent (e.g., ethanol, methanol, propanol, isopropanol, butanol, pentanol, isopentanol, hexanol, heptanol, etc.), cyclohexyl acetate, acetone, toluene, cyclohexane, a C1 to C10 alkane series solvent (e.g., hexane), or a combination thereof.

The first emission layer may be substantially insoluble to a C1 to C10 alcohol solvent.

The second emission layer may not include arylamine. The first emission layer may not include an organic compound having a heterocycle including oxygen, sulfur, nitrogen, or silicon.

The second emission layer may further include a second organic ligand that is different from the first organic ligand, and the second organic ligand may include a C3 to C20 organic compound having a thiol group and an alcohol group. In an embodiment, the second emission layer may not include a thiol organic ligand as described above.

The first emission layer may further include a second organic ligand that is different from the first organic ligand, and the second organic ligand may further include a C3 to C40 alkanethiol. In an embodiment, the first emission layer may not include a thiol organic ligand.

The emission layer may further include a third emission layer including quantum dots having different electrical properties from the first and second emission layers between the first emission layer 13b and the second emission layer 13a. The quantum dots included in the third emission layer may further include metal oxide (e.g., aluminum oxide, etc.) on the surface.

The emission layer 13 (e.g., the first emission layer, the second emission layer, or the combination thereof) may have a HOMO energy level of greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6.0 eV. The emission layer 13 may have a HOMO energy level of less than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. In an embodiment, the emission layer 13 may have a HOMO energy level of about 5.5 eV to about 6.1 eV.

The emission layer 13 (e.g., the first emission layer, the second emission layer, or the combination thereof) may have for example an LUMO energy level of less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The emission layer 13 may have an LUMO energy level of greater than or equal to about 2.5 eV, for example, greater than or equal to about 2.6 eV, greater than or equal to about 2.7 eV, or greater than or equal to about 2.8 eV. In an embodiment, the emission layer 13 may have an energy bandgap of about 2.4 eV to about 3.5 eV.

The light emitting device according to an embodiment may include a charge auxiliary layer. The charge auxiliary layer may include an electron auxiliary layer, a hole auxiliary layer, or a combination thereof.

The hole auxiliary layer 12 may be disposed between the first electrode 11 (e.g., anode) and the emission layer 13. The hole auxiliary layer 12 may have one layer or two or more layers and may include, for example a hole injection layer, a hole transport layer, an electron blocking layer, or a combination thereof.

The hole auxiliary layer 12 may have a HOMO energy level that matches a HOMO energy level of the emission layer 13 and mobility of holes from the hole auxiliary layer 12 into the emission layer 13 may be aided.

The HOMO energy level of the hole auxiliary layer 12 (e.g., hole transport layer (HTL)) contacting the emission layer may be the same as or smaller than the HOMO energy level of the emission layer 13 by a value within a range of less than or equal to about 1.0 eV. For example, a difference of HOMO energy levels between the hole auxiliary layer 12 and the emission layer 13 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The HOMO energy level of the hole auxiliary layer 12 may be for example greater than or equal to about 5.0 eV, for example, greater than or equal to about 5.2 eV, greater than or equal to about 5.4 eV, greater than or equal to about 5.6 eV, or greater than or equal to about 5.8 eV. For example, the HOMO energy level of the hole auxiliary layer 12 may be about 5.0 eV to about 7.0 eV, about 5.2 eV to 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

In an embodiment, the hole auxiliary layer 12 may include a hole injection layer near to the first electrode 11 and a hole transport layer near to the emission layer 13. Herein, the HOMO energy level of the hole injection layer may be about 5.0 eV to about 6.0 eV, about 5.0 eV to about 5.5 eV, about 5.0 eV to about 5.4 eV and the HOMO energy level of the hole transport layer may be about 5.2 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV.

A material included in the hole auxiliary layer 12 (e.g., hole transport layer or hole injection layer) is not particularly limited and may include for example poly[(9,9-dioctyl-fluorene-2,7-diyl)-co-(N-(4-butylphenyl)-diphenylamine)] (TFB), polyarylamine, poly(N-vinylcarbazole, poly(3,4-ethylenedioxythiophene) (PEDOT), poly(3,4-ethylenedioxythiophene)polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolyl amino)phenylcyclohexane (TAPC), diipyrazino[2,3-f:2',3'-h]quinoxaline-2,3,6,7,10,11-hexacarbonitrile (HAT-CN), p-type metal oxide (e.g., $NiO$, $WO_3$, $MoO_3$, etc.), a carbon-based material such as graphene oxide, or a combination thereof, but is not limited thereto.

In the hole auxiliary layer(s), a thickness of each layer may be appropriately selected. For example, the thickness of each layer may be greater than or equal to about 10 nm, for example, greater than or equal to about 15 nm, greater than or equal to about 20 nm, and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The electron auxiliary layer 14 may be disposed between the emission layer 13 and the second electrode 15 (e.g., cathode). The electron auxiliary layer 14 may include for example an electron injection layer, an electron transport layer, a hole blocking layer, or a combination thereof, but is not limited thereto. In an embodiment, the electron auxiliary layer 14 may include an electron transport layer.

The electron transport layer, the electron injection layer, or a combination thereof may include for example 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, $ET_2O_4$ (8-(4-(4,6-di(naphthalen-2-yl)-1,3,5-triazin-2-yl)phenyl)quinolone), 8-hydroxyquinolinato lithium (Liq), n-type metal oxide (e.g., $ZnO$, $HfO_2$, etc.), or a combination thereof, but is not limited thereto. The hole blocking layer may include for example 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but is not limited thereto.

In an embodiment, the electron auxiliary layer 14 (e.g., electron transport layer) includes a plurality of nanoparticles. The nanoparticles include a metal oxide including zinc.

The metal oxide may include $Zn_{1-x}M_xO$ (wherein M is Mg, Ca, Zr, W, Li, Ti, or a combination thereof and $0 \leq x \leq 0.5$). In an embodiment, in Chemical Formula 1, M may be magnesium (Mg). In an embodiment, in Chemical Formula 1, x may be greater than or equal to about 0.01 and less than or equal to about 0.3, for example, less than or equal to about 0.25, less than or equal to about 0.2, or less than or equal to about 0.15.

The metal oxide may include zinc oxide, zinc magnesium oxide, or a combination thereof. An absolute value of LUMO of quantum dots included in the emission layer may be smaller than an absolute value of LUMO of the metal oxide. In an embodiment, an absolute value of LUMO of quantum dots may be larger than an absolute value of LUMO of a metal oxide ETL. An absolute value of LUMO of blue QD may be smaller than an absolute value of LUMO of a metal oxide ETL. Electron injection in an electroluminescent device including blue QD may be different from a light emitting device including red or green quantum dots.

An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape. The nanoparticles may not have a nano wire shape.

In an embodiment, each thickness of the electron auxiliary layer 14 (e.g., an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 2:
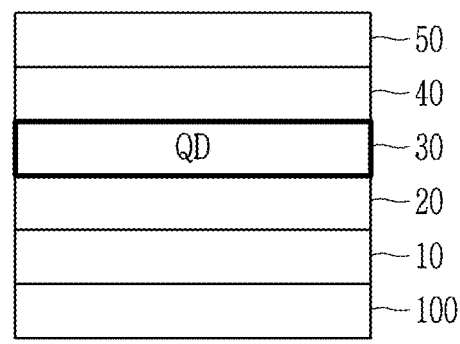
FIG. 2 is a schematic cross-sectional view of a QD LED device according to an embodiment.

A device according to an embodiment may have a normal structure. In an embodiment, in the device, an anode 10 disposed on a transparent substrate 100 may include a metal oxide-based transparent electrode (e.g., ITO electrode) and a cathode 50 facing the anode 10 may include a conductive metal (e.g., Mg, Al, Ag, or a combination thereof) (e.g., having a relatively low work function). A hole auxiliary layer 20 (e.g., a hole injection layer of PEDOT:PSS, p-type metal oxide, or a combination thereof, and the like; a hole transport layer of TFB, poly(N-vinylcarbazole) (PVK), or a combination thereof; or a combination thereof) may be disposed between the transparent electrode 10 and the quantum dot emission layer 30. The hole injection layer may be near to the transparent electrode and the hole transport layer may be near to the emission layer. An electron auxiliary layer 40 such as an electron injection layer/an electron transport layer may be disposed between the quantum dot emission layer 30 and the cathode 50. (see FIG. 2)

Figure 3:
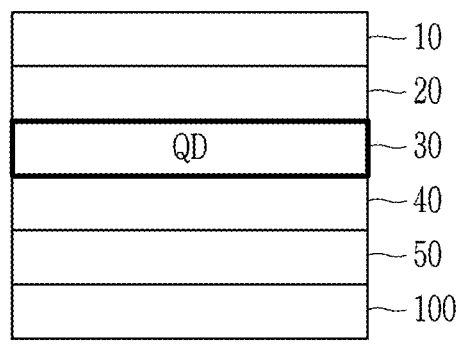
FIG. 3 is a schematic cross-sectional view of a QD LED device according to an embodiment.

A device according to an embodiment may have an inverted structure. A cathode 50 disposed on the transparent substrate 100 may include a metal oxide-based transparent electrode (e.g., ITO) and an anode 10 facing the cathode may include a metal (e.g., Au, Ag, Al, Mg, or a combination thereof) (e.g., having a relatively high work function). For example, (optionally doped) n-type metal oxide (crystalline Zn metal oxide) may be disposed between the transparent electrode 50 and the emission layer 30 as an electron auxiliary layer 40 (e.g., electron transport layer). $MoO_3$ or other p-type metal oxides may be disposed between the metal anode 10 and the quantum dot emission layer 30 as a hole auxiliary layer 20 (e.g., a hole transport layer including TFB, PVK, or a combination thereof; a hole injection layer including $MoO_3$ or other p-type metal oxides; or a combination thereof). (refer to FIG. 3)

An embodiment provides a method of manufacturing the aforementioned light emitting device. The manufacturing method may include forming an emission layer on a first electrode; forming a charge auxiliary layer on the emission layer; and forming a second electrode on the charge auxiliary layer, wherein the forming of the emission layer includes forming a first layer including a plurality of quantum dots having a first organic ligand on the surface; removing at least a portion of (e.g., a portion of) the first organic ligand from the first layer; and forming a second layer (e.g., first emission layer) including a plurality of quantum dots having a first organic ligand on the surface, on the ligand-treated first layer (e.g., second emission layer).

The charge auxiliary layer may be an electron auxiliary layer.

The method may further include forming a charge auxiliary layer (e.g., hole auxiliary layer) on the first electrode before forming the emission layer on the first electrode. In this case, the emission layer may be formed on the charge auxiliary layer disposed on the first electrode.

The first electrode, the emission layer, the charge auxiliary layer, and the second electrode are the same as described above.

The forming of the emission layer may be performed by dispersing the quantum dots in a solvent (e.g., organic solvent) to obtain a quantum dot dispersion and applying or depositing the quantum dot dispersion on the substrate or the charge auxiliary layer in an appropriate manner (e.g., spin coating, inkjet printing, etc.). The forming of the emission layer may further include heat-treating the applied or deposited quantum dot layer. The heat-treating temperature is not particularly limited, and may be appropriately selected considering a boiling point of the organic solvent. For example, the heat-treating temperature may be greater than or equal to about 60° C. The organic solvent of the quantum dot dispersion is not particularly limited and thus may be appropriately selected. In an embodiment, the organic solvent may include a (substituted or unsubstituted) aliphatic hydrocarbon organic solvent, a (substituted or unsubstituted) aromatic hydrocarbon organic solvent, an acetate solvent, or a combination thereof.

The removing of the ligand from the formed first layer may include preparing an alcohol solution of a metal halide; contacting the alcohol solution with the first layer; and removing the alcohol solution from the first layer and drying the first layer.

The metal halide may include Group II metal (e.g., zinc). The metal halide may include a fluoride, a chloride, a bromide, an iodide, or a combination thereof. In an embodiment, the metal halide may include a zinc chloride.

The preparing of the alcohol solution of the metal halide may include dissolving the aforementioned metal halide in an alcohol solvent (e.g., C1 to C10 alcohol, for example, methanol, ethanol, propanol, isopropanol, butanol, pentanol, hexanol, heptanol, etc.). A metal halide concentration in the alcohol solution may be greater than or equal to about 0.001 grams per liter (g/L), for example, greater than or equal to about 0.01 g/L, greater than or equal to about 0.1 g/L, greater than or equal to about 1 g/L, greater than or equal to about 10 g/L, greater than or equal to about 50 g/L, greater than or equal to about 60 g/L, greater than or equal to about 70 g/L, greater than or equal to about 80 g/L, or greater than or equal to about 90 g/L and less than or equal to about 1000 g/L, for example, less than or equal to about 500 g/L, less than or equal to about 400 g/L, less than or equal to about 300 g/L, less than or equal to about 200 g/L, less than or equal to about 100 g/L, less than or equal to about 90 g/L, less than or equal to about 80 g/L, less than or equal to about 70 g/L, less than or equal to about 60 g/L, less than or equal to about 50 g/L, less than or equal to about 40 g/L, less than or equal to about 30 g/L, less than or equal to about 20 g/L, or less than or equal to about 10 g/L, but is not limited thereto.

Contacting the alcohol solution with the first layer may include adding the alcohol solution to the first layer in a dropwise fashion, spin coating the alcohol solution after adding the alcohol solution in a dropwise fashion, or a combination thereof. The adding in a dropwise fashion (and spin coating) may be performed at least once, for example, at least twice, at least three times, or at least four times.

The removing of the alcohol solution from the first layer may include washing (e.g., adding the alcohol solvent in a dropwise fashion and optionally spin coating) the first layer contacting the alcohol solution, with an alcohol solvent. The washing may be performed at least once, for example, at least twice, or at least three times.

The drying of the first layer from which the alcohol solution is removed may include heating the first layer at a predetermined temperature.

The heating temperature may be greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The heating temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., or less than or equal to about 90° C.

The first layer (e.g., the second emission layer in the light emitting device) may exhibit changed solubility through a ligand removal treatment, and accordingly, a quantum dot dispersion may be applied or deposited on the first layer which is subjected to the ligand removal treatment, to form the second layer (e.g., the first emission layer in the light emitting device).

The quantum dot dispersion may include quantum dots having the same (or different) organic ligands as (or from) the ones of the quantum dots used for the formation of the first layer. The quantum dot dispersion may be treated with an organic solution including a halogen compound (e.g., a chlorine compound such as a metal chloride) prior to the formation of the second layer. The quantum dot dispersion (e.g., for forming the second layer) may include the halogen treated quantum dots as described above.

The second layer thus formed may be heat-treated, if desired. Details (e.g., a temperature) of the heat treatment may be the same as described above for the heating temperature.

It may not be easy to form a thin film by coating dispersion of quantum dots including the same type of organic ligand multiple times. Without wishing to be bound by any theory, it is believed that a solvent in the quantum dot dispersion dissolves a previously coated QD layer. For example, the dispersion of quantum dots including the same type of organic ligand may not be used to form a quantum dot emission film having a desired thickness more than once.

In a method according to an embodiment, since dissolubility/dispersibility of quantum dots in the layer which is subjected to the ligand removal treatment (e.g., halide exchange-treatment) is changed, the quantum dot layer which is subjected to halide exchange-treatment is not dissolved by the dispersion of quantum dots including the same type of organic ligand. In other words, since polarity of the treated first layer is changed, the quantum dot dispersion used for forming the first layer may be coated without undesirable dissolution of the first layer which is subjected to the ligand removal treatment.

On the formed second layer, a charge auxiliary layer (e.g., an electron auxiliary layer) and an electrode (e.g., cathode) may be optionally formed. The charge auxiliary layer (e.g., electron auxiliary layer) may be formed in an appropriate method by considering a material, a thickness, and the like of the charge auxiliary layer.

For example, since the formed second layer may not be dissolved in an alcohol solvent, when an electron transport layer is formed based on the aforementioned zinc-containing metal oxide nanoparticles, the nanoparticles dispersed in the alcohol solvent may be applied on the aforementioned emission layer.

An embodiment provides an electronic device including the aforementioned light emitting device. The electronic device may include various electronic devices such as display devices or lighting devices.

Hereinafter, embodiments are illustrated in more detail with reference to examples. However, these examples are exemplary, and the present scope is not limited thereto.

Analysis Methods

1. Photoluminescence Analysis

Photoluminescence (PL) spectra of the prepared nanocrystal are obtained using a Hitachi F-7000 spectrometer at an irradiation wavelength of 372 nanometers (nm).

2. Ultraviolet (UV) Spectroscopy

Hitachi U-3310 spectrometer is used to perform a UV spectroscopy and obtain UV-Visible absorption spectra.

3. TEM Analysis

Transmission electron microscope photographs of nanocrystals are obtained using an UT F30 Tecnai electron microscope.

4. X-ray Diffraction (XRD) Analysis

An XRD analysis is performed using a Philips XPert PRO equipment with a power of 3 kilowatts (kW).

5. Electroluminescence Spectroscopy

A current depending on a voltage is measured using a Keithley 2635B source meter while applying a voltage and Electroluminescent (EL) light emitting luminance is measured using a CS2000 spectroscopy.

6. Evaluation of Hole Transport Capability

A hole-only device (HOD) (indium tin oxide (ITO)/poly (3,4-ethylenedioxythiophene)polystyrene sulfonate (PEDOT:PSS)/poly(9,9-dioctyl-fluorene-co-N-(4-butylphenyl)-diphenylamine) (TFB)/quantum dot (QD) emission layer/organic HTL/diipyrazino[2,3f:2',3'-h]quinoxaline-2,3,6,7,10,11-hexacarbonitrile (HAT-CN)/Ag) is manufactured in the following method. An ITO patterned substrate is subjected to an ultraviolet (UV)-ozone (UVO)-surface treatment. A PEDOT:PSS layer is spin-coated to have a thickness of about 30 nm and then, heat-treated to remove residual organic materials. A TFB layer is spin-coated to have a thickness of about 25 nm and then, heat-treated to remove residual organic materials. Quantum dot dispersion is spin-coated to form a 15 to 40 nm-thick emission layer and then, heat-treated to remove residual organic materials. An upper hole transport layer is formed by sequentially thermally depositing an organic HTL (e.g., including a compound having a bi-carbazole moiety and a bi-phenyl moiety)/HAT- CN (dipyrazino[2,3-f:2',3'-h]quinoxaline-2,3,6,7,10,11-hexacarbonitrile) layer to be 35 to 40 nm (e.g., 360 Å) thick/10 to 15 nm (e.g., 100 Å) thick. Then, silver (Ag) is thermally deposited under a mask to form an electrode. The resulting device is sealed with a sealing resin/glass.

Hole transport capability of the manufactured HOD is evaluated by measuring a current depending on a voltage by using a Keithley 2635B source meter, while the voltage is applied thereto.

6. Infrared Spectroscopy

An infrared spectroscopy is performed using an infrared spectroscopic analyzer.

7. X-Ray Photoelectron Spectroscopy (XPS) Analysis

An XPS element analysis is performed under the conditions of an acceleration voltage: 0.5 to 15 kiloelectronvolts (keV), 300 watts (W), and a minimum analysis area: 200× 200 square micrometers (μm$^2$) using Quantum 2000 made by Physical Electronics, Inc.

8. Scanning Electron Microscope Energy Dispersive X-Ray Spectroscopy (SEM-EDS) Analysis A SEM-EDX analysis is performed using a scanning electron microscope.

Synthesis of Quantum Dot

Reference Example 1-1: Preparation of Blue Light Emitting Quantum Dot (1) Selenium (Se) and tellurium (Te) are dispersed in trioctylphosphine (TOP) to obtain a Se/TOP stock solution and Te/TOP stock solution, respectively. 0.125 millimoles (mmol) of zinc acetate is added with oleic acid (OA) to a reactor including trioctylamine and vacuum-treated at 120° C. After 1 hour, an atmosphere in the reactor is replaced with nitrogen.

Subsequently, the reactor is heated up to 300° C., the prepared Se/TOP stock solution and Te/TOP stock solution are rapidly injected thereinto in a Te/Se ratio of 1/25. When the reaction is complete, acetone is added to the reaction solution that is rapidly cooled into room temperature, and a precipitate obtained by centrifugation is dispersed in toluene to obtain a ZnTeSe core.

(2) 1.8 mmoL (0.336 grams (g)) of zinc acetate is added with oleic acid to a flask including trioctylamine and vacuum-treated at 120° C. for 10 minutes. The atmosphere in the flask is substituted with nitrogen (N$_2$) and a temperature is increased up to 180° C. The ZnTeSe core obtained above is added and Se/TOP stock solution and S/TOP stock solution prepared by dispersing sulfur (S) in trioctylphosphine are injected. The reaction temperature is set to be about 280° C. After the reaction is complete, the reactor is cooled and the prepared nanocrystal is centrifuged with ethanol and is dispersed in an organic solvent (e.g., toluene or octane) to obtain a dispersion of ZnTeSe/ZnSeS core/shell quantum dots.

Reference Example 1-2: Preparation of Red Light Emitting Quantum Dot (1) 0.2 mmol of indium acetate is dissolved with palmitic acid in a 300 milliliters (mL) reaction flask including 1-octadecene and heated at 120° C. under vacuum. After 1 hour, atmosphere in the reactor is replaced with nitrogen. After heating at 280° C., a mixture of tris(trimethylsilyl) phosphine (TMS$_3$P) trioctylphosphine are rapidly injected and reacted for 30 minutes. Acetone is added to the reaction solution which has been rapidly cooled at room temperature and centrifuged to provide a precipitate (i.e., InP core), and the obtained precipitate is dispersed in toluene.

A Se powder and a S powder are dissolved in TOP to prepare a Se/TOP stock solution and an S/TOP stock solution, respectively.

Zinc acetate and oleic acid are dissolved in trioctylamine in a 300 mL reaction flask and vacuum-treated at 120° C. for 10 minutes. The atmosphere in the flask is substituted with nitrogen (N$_2$) and then heated at 180° C.

The obtained InP core is added and a predetermined amount of the Se/TOP stock solution and a predetermined amount of the S/TOP stock solution were added, and a reaction is performed at reaction temperature of 280° C. for 60 minutes.

An excess amount of ethanol is added into the reaction mixture including the semiconductor nanocrystal and centrifuged. After the centrifugation, a supernatant is discarded, the precipitate is dried and then dispersed in chloroform or toluene to provide a InP/ZnSeS core/shell quantum dot solution (hereinafter, QD solution). The obtained QD solution is measured for a UV-vis absorption spectrum. The obtained quantum dots emit red light.

Synthesis of Metal Oxide Nanoparticles

Reference Example 2: Synthesis of Zn Metal Oxide Nanoparticles

Zinc acetate dihydrate and magnesium acetate tetrahydrate are added to dimethylsulfoxide in a reactor so that a mole ratio of the following chemical formula is provided, and the reactor is heated at 60° C. in the air. Subsequently, an ethanol solution of tetramethyl ammonium hydroxide pentahydrate is added in a dropwise fashion thereto at a rate of 3 milliliters per minute (mL/min). The obtained mixture is stirred for one hour, and $Zn_xMg_{1-x}O$ nanoparticles produced therein are centrifuged and dispersed in ethanol to obtain $Zn_xMg_{1-x}O$ (x=0.85) nanoparticles.

The obtained nanoparticles are performed with an X-ray diffraction analysis to confirm that ZnO crystals are formed. A transmission electron microscopic analysis is performed for the obtained nanoparticles, and the results shows that the particles have an average size of about 3 nm.

The obtained nanoparticles are measured for their UV-Vis absorption spectrum by using UV-Vis Spectrophotometer (UV-2600, SHIMADZU), and an energy bandgap of the nanoparticles is obtained from a UV band edge tangent line. The results show that the synthesized $Zn_xMg_{1-x}O$ has an energy bandgap of about 3.52 electronvolts (eV) to 3.70 eV.

Spin-Dry Treatment

Reference Example 3-1

A quantum dot emission layer is formed by spin-coating an octane dispersion of the core/shell quantum dots according to Reference Example 1-1 on a silicon substrate and heat-treating at 80° C. for 30 minutes. An infrared ray spectroscopy regarding the obtained quantum dot emission film is performed to measure COO$^-$ peak intensity relative to a Si peak, and the result is shown in Table 1 and FIG. 4.

An X-ray photoelectron spectroscopy regarding the quantum dot emission film is performed, and the result is shown in Table 2.

A SEM-EDX analysis regarding the spin-dried quantum dot emission film is performed, and the result is shown in Table 3.

Reference Example 3-2

A solution prepared by dissolving zinc chloride in ethanol (concentration: 0.1 grams per milliliter (g/mL)) is added in a dropwise fashion on the quantum dot emission layer formed in Reference Example 3-1, allowed to stand for one minute, partially removed with a spin-coater, and three times washed with ethanol. The washed first layer is dried on an 80° C. hot plate for 20 minutes. An infrared spectroscopy regarding the obtained (hereinafter, spin-dried) quantum dot emission film is performed to measure a COO— peak intensity relative to an Si peak, and the result is shown in Table 1 and FIG. 4.

An X-ray diffraction analysis of the spin-dried quantum dot emission film is performed, and the result is shown in Table 2. The X-ray diffraction analysis result shows a defect, which is regarded as $ZnCl_2$, on the spin-dried layer.

A SEM-EDX analysis regarding the spin-dried quantum dot emission film is performed, and the result is shown in Table 3.

Reference Example 4-1

A quantum dot emission layer is formed by spin-coating an octane dispersion of the core/shell quantum dots according to Reference Example 1-2 on a silicon substrate and heat-treating at 80° C. for 30 minutes. An infrared spectroscopy regarding the quantum dot emission film is performed to measure COO— peak intensity relative to an Si peak, and the result is shown in Table 1 and FIG. 5.

Reference Example 4-2

A solution prepared by dissolving zinc chloride in ethanol (concentration: 0.1 g/mL) is added in a dropwise fashion on the quantum dot emission layer formed in Reference Example 4-1, allowed to stand for 1 minute, partially removed with a spin-coater, and three times washed with ethanol (EtOH). The washed first layer is dried on an 80° C. hot plate for 20 minutes. An infrared spectroscopy regarding the obtained (hereinafter, spin-dried) quantum dot emission film is performed to measure COO— peak intensity relative to an Si peak, and the results are shown in Table 1 and FIG. 5.

TABLE 1

|  | COO/Si peak intensity | Oleic Acid (OA) decrease |
| --- | --- | --- |
| Reference Example 3-1 | 1.13 | reference |
| Reference Example 3-2 | 0.78 | 31.1% |
| Reference Example 4-1 | 1.50 | reference |
| Reference Example 4-2 | 0.85 | 43.2% |

Figure 4:
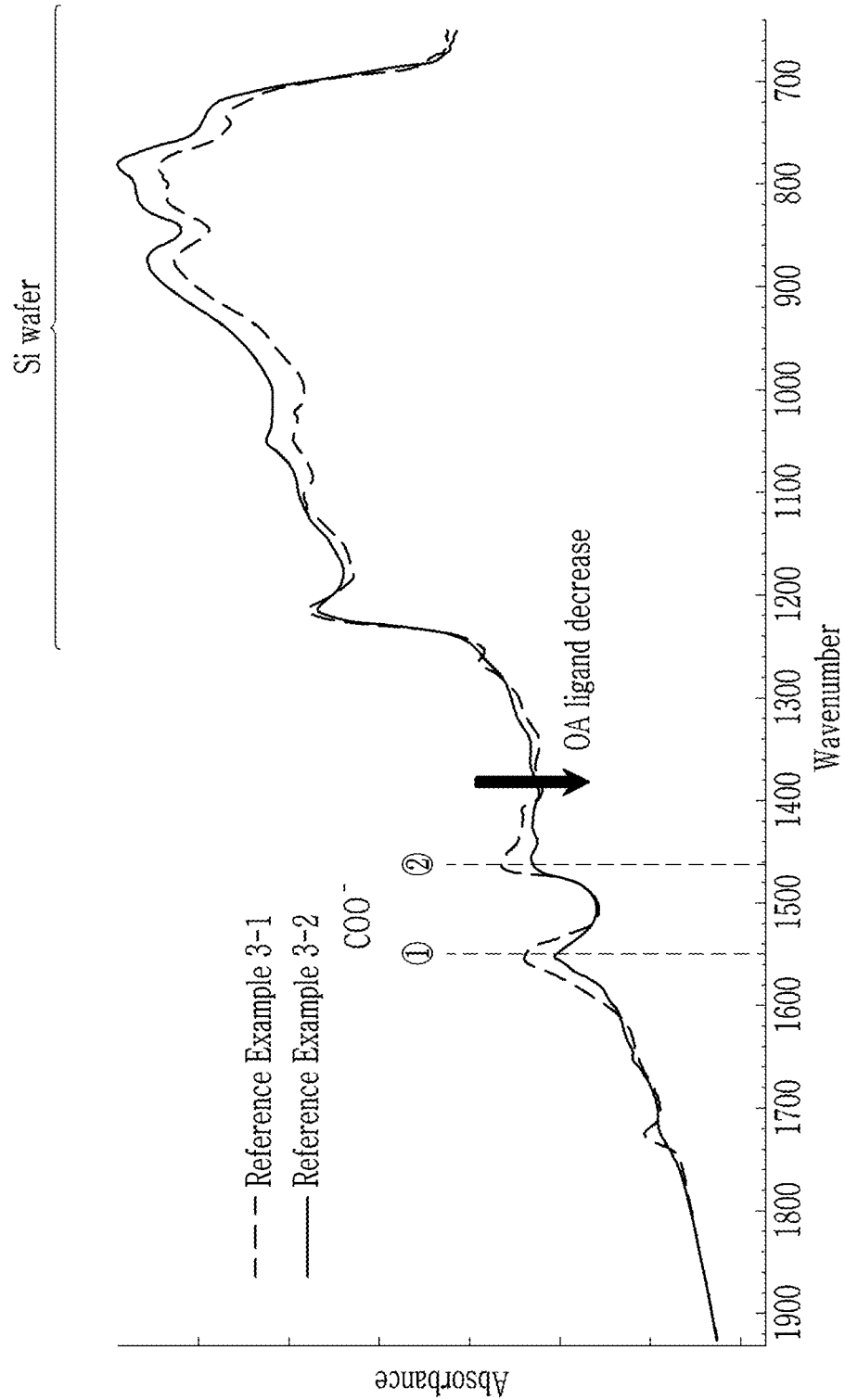
FIG. 4 shows infrared spectroscopy results of the quantum dot emission layers produced in Reference Example 3-1 and Reference Example 3-2.
Figure 5:
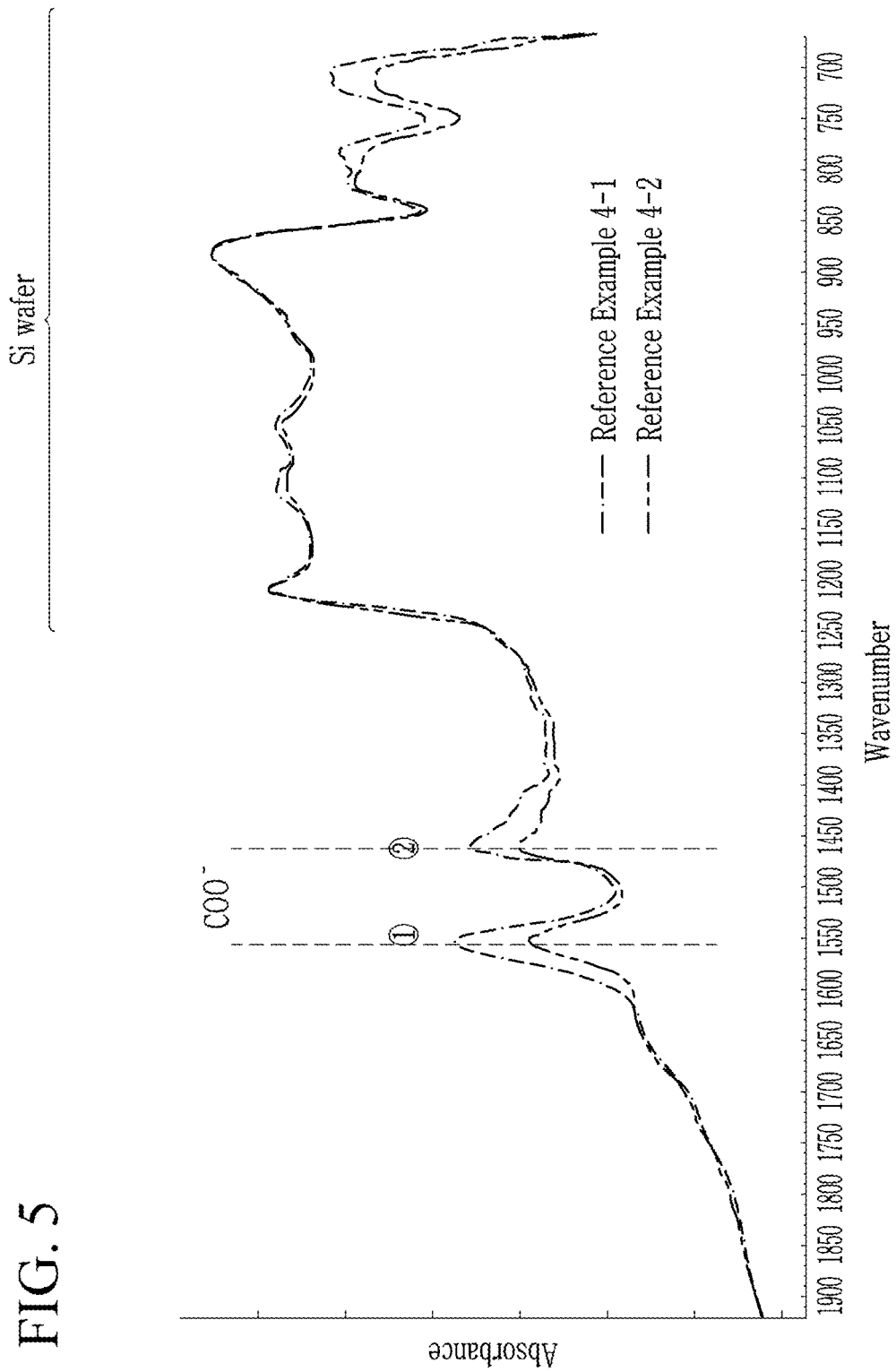
FIG. 5 shows infrared spectroscopy results of the quantum dot emission layers produced in Reference Example 4-1 and Reference Example 4-2.

Referring to the results of Table 1 and FIGS. 4 and 5, amounts of the organic ligands bound to quantum dots during the synthesis are greatly decreased through the spin-dry treatment, and accordingly, chloride (Cl—) instead of COO— may be bound to the quantum dots included in the quantum dot thin film.

TABLE 2

|  | C1s | Zn2p3 |
| --- | --- | --- |
| Reference Example 3-1 (OA-QD) | 55.92 | 20.88 |
| Reference Example 3-2 $ZnCl_2$/EtOH = 100 milligrams per milliliter (mg/ml) (Spin-dry OA-QD) | 38.57 | 32.29 |

Referring to Table 2, an amount of carbon relative to that of zinc is greatly reduced through the spin dry treatment (from 55.92:20.88 to 38.57:32.29).

TABLE 3

| Atomic ratio | Reference Example 3-1: OA-QD | Reference Example 3-2: Spin-dry OA-QD |
| --- | --- | --- |
| Cl:Zn | 0.0:1 | 0.10:1 |

Referring to Table 3, an amount of chlorine relative to that of zinc is increased in a significant level (from 0.0:1 to 0.10:1).

Preparation of Halogen Treated Quantum Dots

Reference Example 4-3

Quantum dots obtained by Reference Example 1-1 are dispersed in toluene to obtain a quantum dot organic dispersion. Zinc chloride is dissolved in ethanol to obtain a zinc chloride solution having a concentration of 10 wt %. 0.01 mL of the obtained zinc chloride solution is added to the prepared quantum dot organic dispersion and then, stirred at 60° C. for 30 minutes to perform a surface exchange reaction. After the reaction, ethanol is added thereto to induce a precipitation, and the quantum dots are recovered through centrifugation. With respect to the recovered quantum dots, the surface exchange reaction is repeated to obtain halogen-treated quantum dots.

Hole Transport Capability Evaluation of Spin-Dried Film

Reference Example 5-1

Hole transport capability of the emission layer including quantum dots according to Reference Example 1-1 is evaluated before and after the spin-dry treatment. The hole transport capability is evaluated by manufacturing a hole only device (ITO/PEDOT:PSS (30 nm)/TFB (25 nm)/QD emission layer (20~30 nm)/organic HTL (36 nm)/HAT-CN (10 nm)/Ag (100 nm)) respectively including a non-spin-dried quantum dot emission layer and the spin-dried quantum dot emission layer according to Reference Example 3-2. As a result, hole transport capability (log scale) of a first layer after the treatment is 148 milliamperes per square centimeter ($mA/cm^2$) at 8 volts (V)), which is about 9867 times higher than hole transport capability (log scale, 0.015 $mA/cm^2$ at 8 V) of the first layer before the treatment.

Reference Example 5-2

Hole transport capability of the layer (SD treated BQD layer) including quantum dots according to Reference Example 1-1 and being spin-dry treated and the layer (Cl-treated BQD layer) including quantum dots according to Reference Example 4-3 is measured as in the same manner set forth in Reference Example 5-1. The results confirm that the HT capability of the SD treated BQD layer is 2.18 times higher than that of the Cl-treated BQD layer.

Manufacture of Light Emitting Device

Example 1-1

A device having a laminate structure of ITO/PEDOT:PSS (30 nm)/TFB (25 nm)/Blue OA less (spin-dry) QD (20 nm)/Blue OA QD (12 nm)/ZnMgO (20 nm)/Al (100 nm) is manufactured as follows.

1. An ITO-deposited glass substrate is surface-treated with UV-ozone for 15 minutes and then spin-coated with a PEDOT:PSS solution (H.C. Starks) and heated at 150° C. for 10 minutes under an air atmosphere, and then is heat-treated again at 150° C. for 10 minutes under an $N_2$ atmosphere to provide a hole injection layer having a thickness of 30 nm. Subsequently, a poly[(9,9-dioctylfluorenyl-2,7-diyl)-co(N-(4-butylphenyl)diphenylamine] solution (TFB) (Sumitomo) is spin-coated on the hole injection layer and heat-treated at 150° C. for 30 minute to form a hole transport layer.

2. On the obtained hole transport layer, core-shell quantum dots prepared by Reference Example 1-1 are spin-coated and heat-treated at 80° C. for 30 minutes to form a quantum dot layer. Zinc chloride is dissolved in ethanol to prepare a treating solution (concentration: 0.1 g/mL). The treating solution is added in a dropwise fashion on the formed quantum dot layer, kept it as it is, removed, and washed with ethanol several times. The washed quantum dot layer is dried on a 80° C. hot plate to obtain a second emission layer as ligand-removal treated.

3. The dispersion of the core/shell quantum dots according to Reference Example 1-1 is spin-coated on the second emission layer as ligand-removal treated and then is heat-treated at 80° C. for 30 minutes to form a first emission layer.

4. A solution of the ZnMgO nanoparticles prepared in Reference Example 2 (solvent: ethanol, optical density: 0.5 a.u) is prepared. The solution is spin-coated on the first emission layer and heat-treated at 80° C. for 30 minutes to form an electron auxiliary layer. On a portion of the surface of the electron auxiliary layer, aluminum (Al) is vacuum-deposited to form a second electrode to manufacture a light emitting device shown in FIG. 1.

Electroluminescent properties of the obtained quantum dot light emitting device are evaluated using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated. The results are shown in Table 4, and FIGS. 6 and 7.

Comparative Example 1

An electroluminescent device (layer structure: ITO/PEDOT:PSS (30 nm)/TFB (25 nm)/Blue OA less (spin-dry) QD (20 nm)/ZnMgO (20 nm)/Al (100 nm)) is manufactured according to the same method as Example 1 except for not forming the first emission layer.

The obtained quantum dot light emitting device is evaluated for electroluminescent properties using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated. The results are shown in Table 4, FIGS. 6 and 7.

Comparative Example 2

A light emitting device (layer structure: ITO/PEDOT:PSS (30 nm)/TFB (25 nm)/Blue OA QD (20 nm)/ZnMgO (20 nm)/Al (100 nm)) is manufactured according to the same method as Example 1 except for not performing the ligand removal (spin dry) treatment during the forming the second emission layer and not forming the first emission layer.

The obtained quantum dot light emitting device is evaluated for electroluminescent properties using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated. The results are shown in Table 4 and FIGS. 6 and 7.

TABLE 4

| Descriptions | Max. EQE | EQE @ 100 nit | Max. Cd/A | $Cd/m^2$ @ 5 milli-amperes (mA) | Lamda max. (nm) | Max Lum |
|---|---|---|---|---|---|---|
| Comparative Example 2 (Blue (B) OA single emission layer) | 3.2 | 2.2 | 1.6 | 44 | 454 | 3740 |
| Comparative Example 1 (B spin-dry single emission layer) | 2.7 | 2.6 | 2.4 | 122 | 461 | 4940 |
| Example 1-1 (B spin-dry/OA double emission layer) | 6.5 | 5.3 | 4.7 | 228 | 457 | 5070 |

\* Max. EQE: maximum external quantum efficiency
\* EQE @ 100 nit: external quantum efficiency at luminance of 100 nit (candelas per square meter ($cd/m^2$))
\* Max. Cd/A (Candelas per ampere): maximum current efficiency
\* λmax: maximum photoluminescence wavelength
\* Max Lum: maximum luminance ($cd/m^2$)

Figure 6:
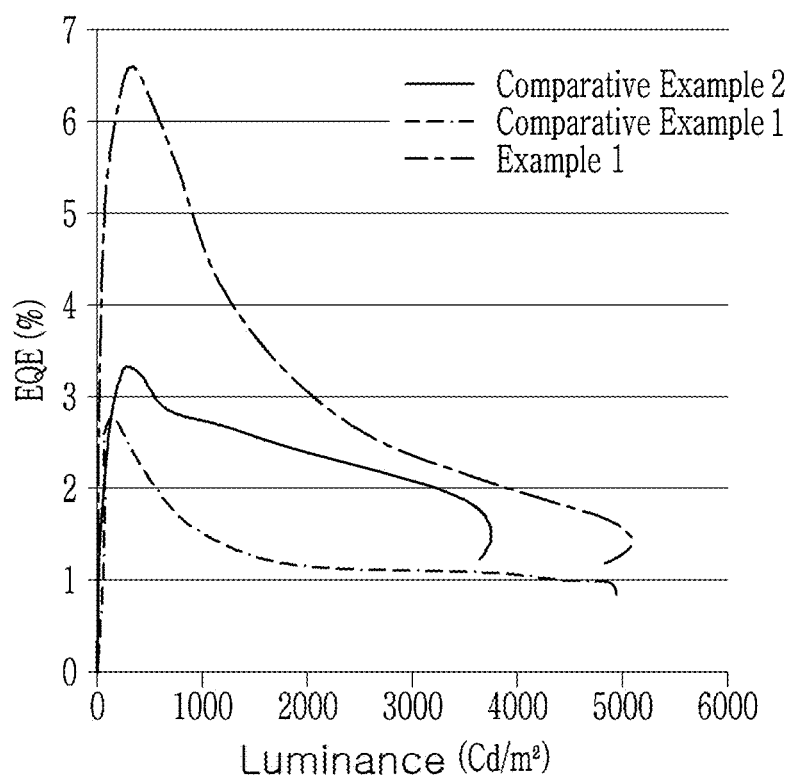
FIG. 6 is a graph of External Quantum Efficiency (EQE) (percent (%)) versus Luminance (candelas per square meter (Cd/m²)) showing electroluminescence properties of the electroluminescent devices of Example 1 and Comparative Examples 1 and 2.
Figure 7:
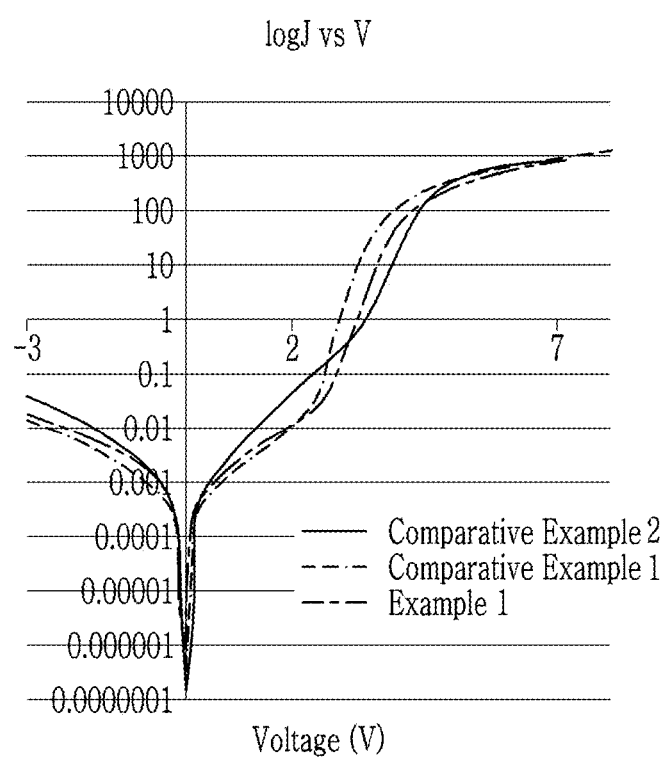
FIG. 7 is a graph of logarithm of current density (J) (milliamperes per square centimeter (mA/cm²)) (log J) versus Voltage (volts (V))) showing electroluminescence properties of the electroluminescent devices of Example 1 and Comparative Examples 1 and 2.

Referring to the results of Table 4 and FIGS. 6 and 7, the device of Example 1 may show improved efficiency and improved luminance but a reduced leakage current compared with the devices of Comparative Examples 1 and 2.

Example 1-2

A light emitting device (layer structure: ITO/PEDOT:PSS (30 nm)/TFB (25 nm)/Blue OA less (spin-dry) QD (20 nm)/halogen treated QD (12 nm)/ZnMgO (20 nm)/Al (100 nm)) is manufactured according to the same method as Example 1 except for the following:

A dispersion of the halogen treated quantum dots prepared in Reference Example 4-3 is spin-coated on the second emission layer as ligand-removal treated and then heat-treated at 80° C. for 30 minutes to form a first emission layer.

The obtained quantum dot light emitting device is evaluated for electroluminescent properties using a Keithley 2200 source measuring device and a Minolta CS2000 spectroradiometer (current-voltage-luminance measurement equipment). A current depending upon a voltage applied to the device, luminance, and electroluminescence (EL) are measured by the current-voltage-luminance measurement equipment, and thereby external quantum efficiency is calculated.

The results confirm that in comparison with the device of Comparative Example 1 (B spin dry single layer), the max EQE and the max luminance of the device of Example 1-2 increase by 3.7 times and 3.6 times, respectively.

Experimental Example 1

Figure 8:
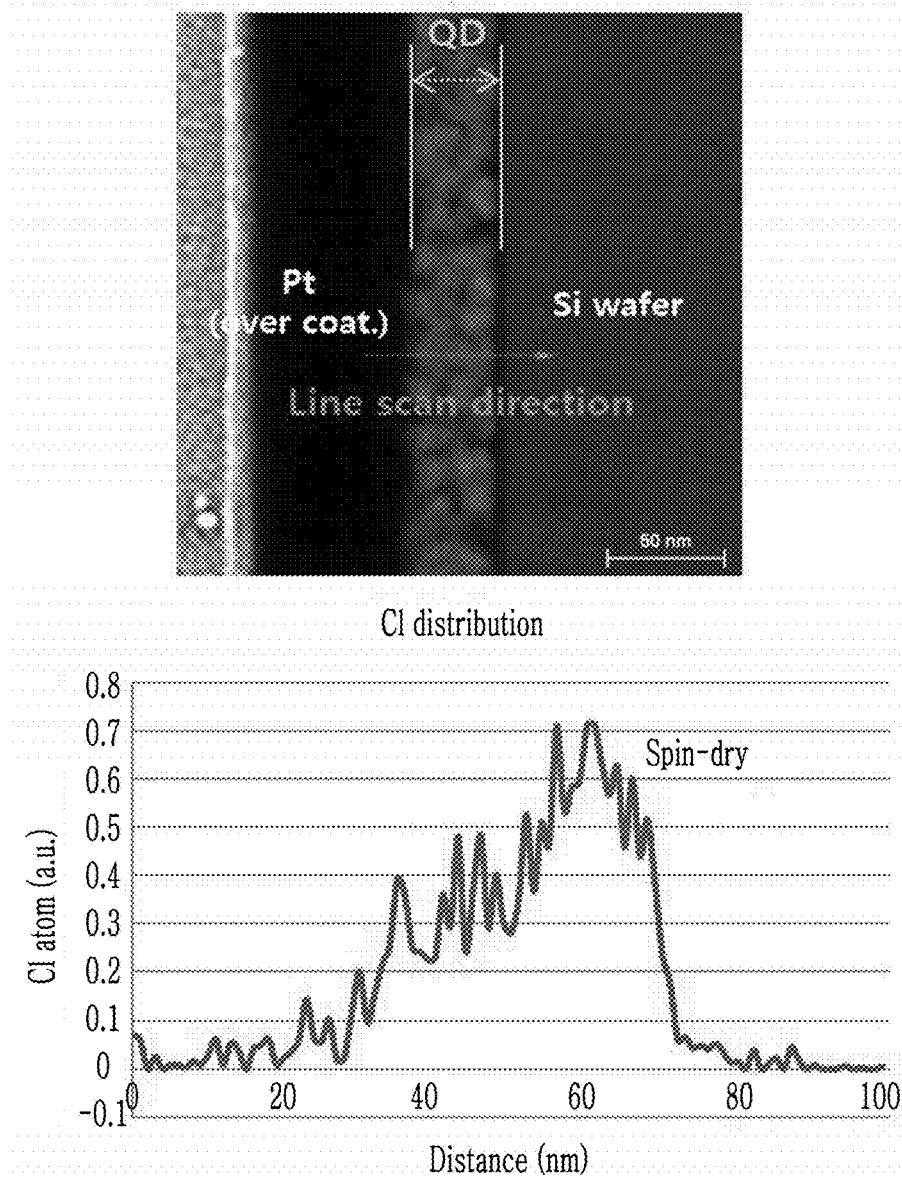
FIG. 8 is a view showing a process of Experimental Example 1 and results thereof.

A quantum dot emission layer (a thickness of 25 nm) is formed on a Si-wafer in the same manner as in Reference Example 4-2 and a Pt over coat is formed. Using a TEM-EDX equipment manufactured by Tecnai Co., Ltd (Titan G2) having EDS of SuperX, a Line scan analysis is made and the results are shown in FIG. 8.

The results show that the spin-dry treated quantum dot emission layer includes a noticeable amount of chlorine.

Experimental Example 2

Two quantum dot emission layers (having a thickness of 40 nm) are formed on a Si-wafer in the same manner as in Reference Example 4-1 (Blue OA) and Reference Example 4-2 (Blue Spin dry), respectively. While etching each of the quantum dot emission layers thus formed via plasma etching, an XPS analysis is made and the results are shown in Table 5.

TABLE 5

| etching time (min) | Blue OA | | Blue Spin-dry | |
|---|---|---|---|---|
| | Cl2p** | Zn2p3 | Cl2p | Zn2p3 |
| 0 | 0.0 | 26.1 | 1.5 | 25.7 |
| 1 | 0.0 | 54.7 | 1.1 | 54.1 |
| 2 | 0.0 | 55.7 | 1.1 | 55.1 |
| 3 | 0.0 | 57.6 | 0.9 | 57.1 |
| 4 | 0.0 | 58.2 | 0.5 | 57.9 |
| 5 | 0.0 | 61.0 | 1.1 | 60.3 |

The results confirm that the quantum dot emission layer formed by the method of Reference Example 4-2 includes a substantial amount of the chlorine.

Experimental Example 3: Lifetime of the Device

For each of the devices of Examples 1-1 and 1-2 and the devices of Comparative Examples 1 and 2, the lifetime of the device (T50) is measured:

T(50): When being operated at 325 nit, times that is taken for 50% decrease of the luminance of the device with respect to its initial value (100%).

The results confirm that the device of Comparative Example 1 (B spin-dry single layer) shows the T50 about 20% less than that of the device of Comparative Example 2 (B OA single layer) while the devices of Examples 1-1 an 1-2 show the T50 values about 1.9 times and 7 times greater than that of the device of Comparative Example 2.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: light emitting device
11: first electrode
12: hole auxiliary layer
13: emission layer
14: electron auxiliary layer
15: second electrode

What is claimed is:

1. A light emitting device, comprising
a first electrode and a second electrode facing each other,
an emission layer disposed between the first electrode and the second electrode, the emission layer comprising quantum dots and a first organic ligand, and
an electron auxiliary layer disposed between the emission layer and the second electrode,
wherein the emission layer comprises a first surface facing the electron auxiliary layer and an opposite second surface facing away from the electron auxiliary layer, and
in the emission layer, an amount of the first organic ligand in a portion adjacent to the first surface is greater than an amount of the first organic ligand in a portion adjacent to the second surface.

2. The light emitting device of claim 1, wherein the amount of the first organic ligand in the portion adjacent to the first surface is at least about 20% larger than the amount of the first organic ligand in the portion adjacent to the second surface.

3. The light emitting device of claim 1, wherein the electron auxiliary layer is an electron auxiliary layer comprising nanoparticles comprising a zinc metal oxide.

4. The light emitting device of claim 3, wherein the zinc metal oxide is represented by Chemical Formula 1:

$$Zn_{1-x}M_xO \qquad \text{Chemical Formula 1}$$

wherein, in the Chemical Formula 1,
M is Mg, Ca, Zr, W, Li, Ti, Y, Al, or a combination thereof, and
$0 \leq x \leq 0.5$.

5. The light emitting device of claim 3, wherein the metal oxide comprises zinc oxide, zinc magnesium oxide, or a combination thereof.

6. The light emitting device of claim 3, wherein an average particle size of the nanoparticles is greater than or equal to about 1 nanometer and less than or equal to about 10 nanometers.

7. The light emitting device of claim 1, wherein a work function of the first electrode is greater than a work function of the second electrode.

8. The light emitting device of claim 1, wherein the first electrode comprises indium tin oxide, or wherein the second electrode comprises a conductive metal.

9. The light emitting device of claim 1, wherein the quantum dots do not comprise cadmium.

10. The light emitting device of claim 1, wherein the quantum dots comprise a first compound comprising indium and phosphorus, a second compound comprising a chalcogen element and zinc, or a combination thereof.

11. The light emitting device of claim 1, wherein the portion adjacent to the first surface comprises the first organic ligand and the portion adjacent to the second surface comprises a second organic ligand that is different from the first organic ligand.

12. The light emitting device of claim 1, wherein the quantum dots are configured to emit light having a same color.

13. The light emitting device of claim 1, wherein in the emission layer, the portion adjacent to the second surface further comprises a halogen.

14. The light emitting device of claim 1, wherein the halogen comprises fluorine, chlorine, bromine, iodine, or a combination thereof.

15. The light emitting device of claim 1, wherein the first organic ligand comprises RCOOH, RNH$_2$, R$_2$NH, R$_3$N, RSH, R$_3$PO, R$_3$P, ROH, RCOOR, RPO(OH)$_2$, RHPOOH, R$_2$POOH, or a combination thereof, wherein, R is independently a substituted or unsubstituted C3 to C40 aliphatic hydrocarbon group, a substituted or unsubstituted C6 to C40 aromatic hydrocarbon group, or a combination thereof.

16. The light emitting device of claim 1, wherein a thickness of the emission layer is greater than or equal to about 2 nanometers and less than or equal to about 100 nanometers.

17. The light emitting device of claim 1, wherein the emission layer comprises a first emission layer comprising the first surface and a second emission layer comprising the second surface, and optionally wherein the first emission layer comprises the first organic ligand and the second emission layer comprises the first organic ligand.

18. The light emitting device of claim 17, wherein a thickness of the first emission layer is greater than or equal to about 3 nanometers and less than or equal to about 50 nanometers.

19. The light emitting device of claim 17, wherein a thickness of the second emission layer is greater than or equal to about 3 nanometers and less than or equal to about 50 nanometers.

20. The light emitting device of claim 17, wherein the second emission layer further comprises a halogen comprising chlorine, fluorine, bromine, iodine, or a combination thereof.

21. A display device comprising the light emitting device of claim 1.

* * * * *